(12) United States Patent
Chu-Kung et al.

(10) Patent No.: US 11,233,148 B2
(45) Date of Patent: Jan. 25, 2022

(54) REDUCING BAND-TO-BAND TUNNELING IN SEMICONDUCTOR DEVICES

(71) Applicant: INTEL CORPORATION, Santa Clara, CA (US)

(72) Inventors: Benjamin Chu-Kung, Portland, OR (US); Jack T. Kavalieros, Portland, OR (US); Seung Hoon Sung, Portland, OR (US); Siddharth Chouksey, Portland, OR (US); Harold W. Kennel, Portland, OR (US); Dipanjan Basu, Hillsboro, OR (US); Ashish Agrawal, Hillsboro, OR (US); Glenn A. Glass, Portland, OR (US); Tahir Ghani, Portland, OR (US); Anand S. Murthy, Portland, OR (US)

(73) Assignee: Intel Corporation, Santa Clara, CA (US)

(*) Notice: Subject to any disclaimer, the term of this patent is extended or adjusted under 35 U.S.C. 154(b) by 114 days.

(21) Appl. No.: 16/649,304

(22) PCT Filed: Nov. 6, 2017

(86) PCT No.: PCT/US2017/060113
§ 371 (c)(1),
(2) Date: Mar. 20, 2020

(87) PCT Pub. No.: WO2019/089050
PCT Pub. Date: May 9, 2019

(65) Prior Publication Data
US 2020/0266296 A1    Aug. 20, 2020

(51) Int. Cl.
*H01L 29/06* (2006.01)
*H01L 29/78* (2006.01)
(Continued)

(52) U.S. Cl.
CPC .... *H01L 29/7848* (2013.01); *H01L 21/02532* (2013.01); *H01L 21/02546* (2013.01);
(Continued)

(58) Field of Classification Search
None
See application file for complete search history.

(56) References Cited

U.S. PATENT DOCUMENTS 5,822,242 A * 10/1998 Chen .................. H01L 29/7885
365/185.01
2004/0004230 A1    1/2004 Hammond et al.
(Continued)

FOREIGN PATENT DOCUMENTS

| WO | 2017003414 A1 | 1/2017 |
| WO | 2017171873 A1 | 10/2017 |
| WO | 2019089050 A1 | 5/2019 |

OTHER PUBLICATIONS

International Search Report and Written Opinion received for PCT Application No. PCT/US2017/060113, dated Aug. 6, 2018. 9 pages.
(Continued)

*Primary Examiner* — Ali Naraghi
(74) *Attorney, Agent, or Firm* — Schwabe, Williamson & Wyatt, P.C.

(57) ABSTRACT

Integrated circuit transistor structures are disclosed that reduce band-to-band tunneling between the channel region and the source/drain region of the transistor, without adversely increasing the extrinsic resistance of the device. In an example embodiment, the structure includes one or more spacer configured to separate the source and/or drain from the channel region. The spacer(s) regions comprise a semiconductor material that provides a relatively high conduction band offset (CBO) and a relatively low valence band offset (VBO) for PMOS devices, and a relatively high VBO and a relatively low CBO for NMOS devices. In some cases,
(Continued)

the spacer includes silicon, germanium, and carbon (e.g., for devices having germanium channel). The proportions may be at least 10% silicon by atomic percentage, at least 85% germanium by atomic percentage, and at least 1% carbon by atomic percentage. Other embodiments are implemented with III-V materials.

25 Claims, 11 Drawing Sheets

(51) Int. Cl.
H01L 21/02 (2006.01)
H01L 29/08 (2006.01)
H01L 29/165 (2006.01)
H01L 29/205 (2006.01)
H01L 29/66 (2006.01)

(52) U.S. Cl.
CPC ........ *H01L 29/0847* (2013.01); *H01L 29/165* (2013.01); *H01L 29/205* (2013.01); *H01L 29/66522* (2013.01); *H01L 29/66545* (2013.01); *H01L 29/66636* (2013.01)

(56) References Cited

U.S. PATENT DOCUMENTS

| | | | |
|---|---|---|---|
| 2007/0001162 A1* | 1/2007 | Orlowski | H01L 27/108 257/19 |
| 2009/0108291 A1 | 4/2009 | Cheng et al. | |
| 2010/0025754 A1* | 2/2010 | Shiba | H01L 27/11568 257/326 |
| 2010/0193854 A1 | 8/2010 | Booth, Jr. et al. | |
| 2014/0209863 A1* | 7/2014 | Kondo | H01L 29/66356 257/29 |
| 2014/0252451 A1* | 9/2014 | Han | G11C 11/407 257/324 |
| 2015/0129926 A1* | 5/2015 | Xiao | H01L 27/0605 257/105 |

OTHER PUBLICATIONS

International Preliminary Report on Patentability received for PCT Application No. PCT/US2017/060113, dated May 12, 2020. 5 pages.
Kolodzey, J. et al., "Energy band offsets of SiGeC heterojunctions", Elsevier, 1997, Thin Solid Films, vol. 302, pp. 201-203.

* cited by examiner

Alternately, source may be spacer-free rather than drain

REDUCING BAND-TO-BAND TUNNELING IN SEMICONDUCTOR DEVICES

This patent application is a U.S. National Phase Application under 35 U.S.C. § 371 of International Application No. PCT/US2017/060113, filed on Nov. 6, 2017, the entire contents of which is hereby incorporated by reference herein.

BACKGROUND

Semiconductor devices are electronic components that exploit the electronic properties of semiconductor materials, such as silicon, germanium, and gallium arsenide. A field-effect transistor (FET) is a semiconductor device that includes three terminals: a gate, a source, and a drain. A FET uses an electric field applied by the gate to control the electrical conductivity of a channel through which charge carriers (e.g., electrons or holes) flow from the source to the drain. In instances where the charge carriers are electrons, the FET is referred to as an n-channel device, and in instances where the charge carriers are holes, the FET is referred to as a p-channel device. Some FETs have a fourth terminal called the body or substrate, which can be used to bias the transistor. In addition, metal-oxide-semiconductor FETs (MOSFETs) include a gate dielectric between the gate and the channel. MOSFETs may also be known as metal-insulator-semiconductor FETs (MISFETSs) or insulated-gate FETs (IGFETs). Complementary MOS (CMOS) structures use a combination of p-channel MOSFET (PMOS) and n-channel MOSFET (NMOS) to implement logic gates and other integrated circuits. When a MOSFET device is biased in the OFF-state, for example in an n-MOS with the gate held in a low state and the drain held in a high state, there will be a relatively large electric field in the channel-drain region which can result in a phenomenon known as band-to-band tunneling (BTBT). BTBT can cause a number of non-trivial issues.

BRIEF DESCRIPTION OF THE DRAWINGS

Features and advantages of embodiments of the claimed subject matter will become apparent as the following Detailed Description proceeds, and upon reference to the Drawings, wherein like numerals depict like parts.

Figure 1A:
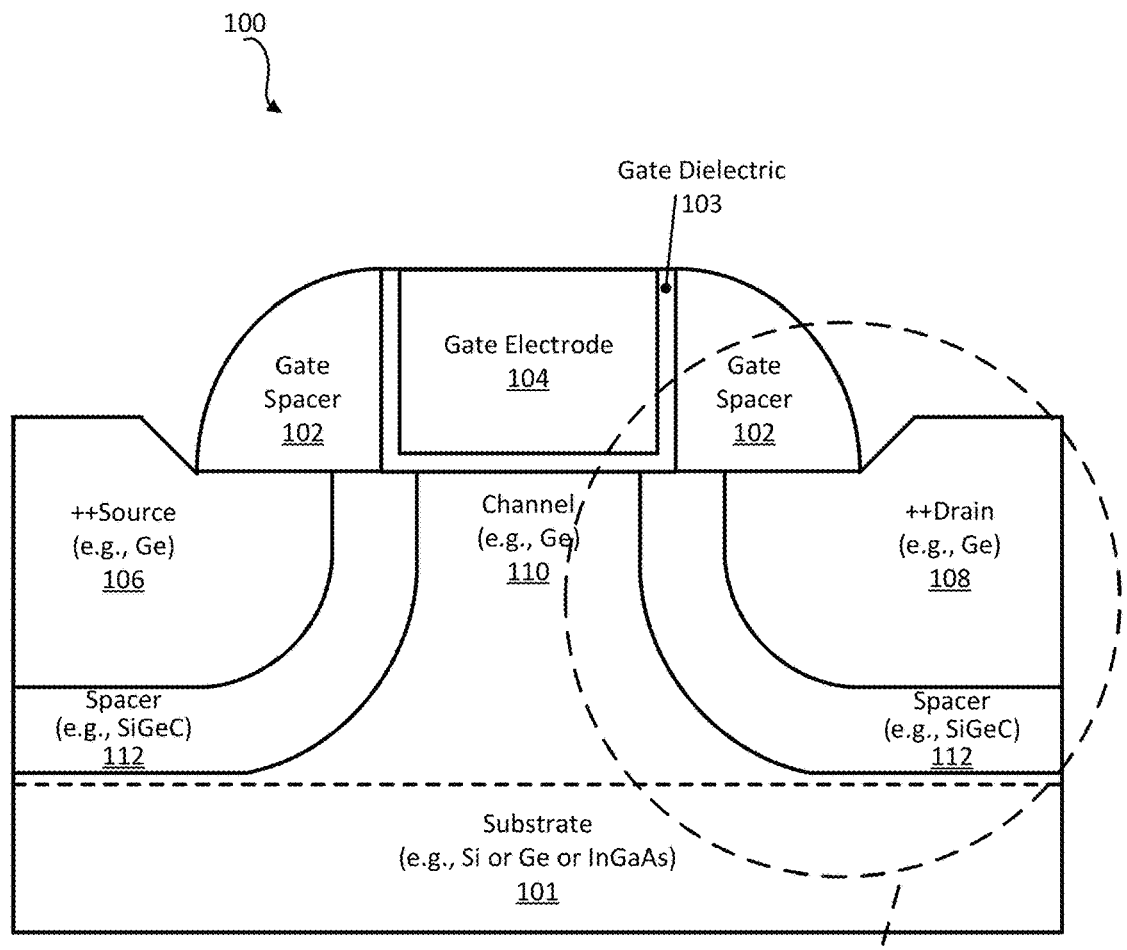
FIGS. 1a-1b each illustrates an example cross-sectional view of an integrated circuit transistor structure, configured in accordance with certain embodiments of the present disclosure.
Figure 1A:
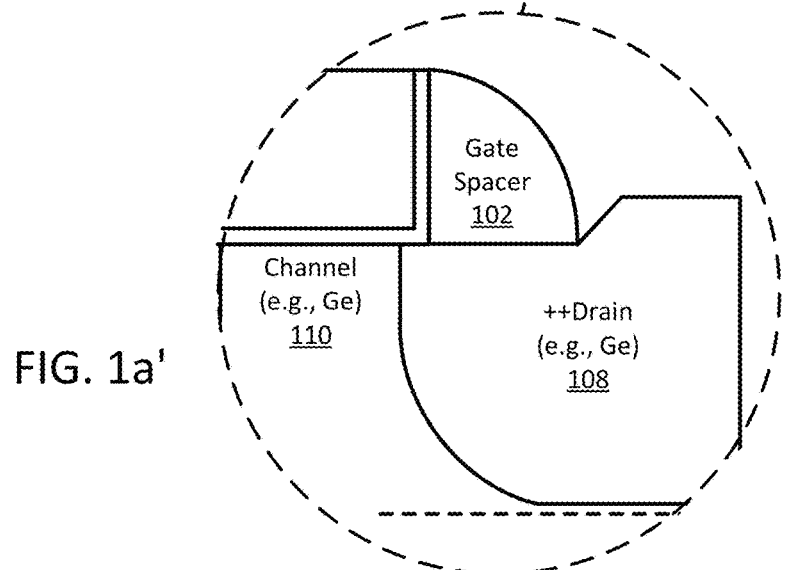

Although the following Detailed Description will proceed with reference being made to illustrative embodiments, many alternatives, modifications, and variations thereof will be apparent in light of this disclosure.

DETAILED DESCRIPTION

Techniques are disclosed for reducing band-to-band tunneling in integrated circuit transistor devices. The techniques can be implemented, for example, to reduce band-to-band tunneling between the channel region and the source/drain regions of the transistor or source-to-drain tunneling, without increasing the extrinsic resistance of the device, according to some embodiments. This may in turn improve device performance and efficiency, and lower the OFF-state current. The techniques include epitaxially providing undoped or lightly-doped semiconductor spacers along with heavily-doped semiconductor materials in the source/drain regions. The source/drain semiconductor spacers are disposed in the source/drain recesses prior to deposition of the heavily-doped source/drain materials, such that the source/drain spacers are between the heavily-doped source/drain regions and the channel region. As will be appreciated in light of this disclosure, the semiconductor material of the source/drain spacers is selected so as to increase the band offset for the carriers that are conducting, without adversely impacting the other band. In an embodiment, the spacer includes a semiconductor material having a bandgap that is greater than the channel bandgap. So, for instance, in PMOS devices, the source/drain spacers comprise a semiconductor material that provides a relatively high conduction band offset (CBO) and a zero or otherwise relatively low valence band offset (VBO), and in NMOS devices, the source/drain spacers comprise a semiconductor material that provides a relatively high VBO and a zero or otherwise relatively low CBO. In some cases, the heavily-doped source/drain material is the same as the source/drain spacer material, except that the spacer material is undoped or only lightly-doped, relative to the subsequently deposited heavily-doped source/drain material. In such cases, note that the dopant can be adjusted by one or more process knobs in step-like or graded fashion, during one continuous source/drain epitaxial deposition process. In other cases, the heavily-doped source/drain material is compositionally distinct from the undoped or lightly-doped source/drain spacer material (i.e., the spacer material is compositionally different, in addition to being differently doped). In any such cases, the arrangement of selected materials provides a band structure configured to reduce the band-to-band tunneling without significant impact to the extrinsic resistance. Numerous configurations will be apparent in light of this disclosure.

General Overview

As previously explained, band-to-band tunneling (BTBT) can cause a number of non-trivial issues. For instance, in the PMOS case of BTBT a hole tunnels from the drain to the channel, and in the NMOS case of BTBT an electron tunnels from the drain to the channel. This can create undesirable effects in the device, including an unacceptable degree of OFF-state current.

To this end, techniques are provided herein to reduce BTBT between the channel region and the source/drain region of transistors. Advantageously, the reduction in BTBT can be accomplished without adversely increasing the extrinsic resistance of the device, according to some embodiments. In an embodiment, an integrated circuit transistor structure includes heavily-doped semiconductor material in the source/drain regions, but with an undoped/lightly-doped source/drain semiconductor spacer between the heavily-doped source/drain semiconductor material and the channel region. The source/drain spacer material is a semiconductor material that increases the band offset for the target carriers, such as a semiconductor material having a bandgap that is greater than the channel bandgap. So, for a PMOS device the source/drain spacer material inhibits tunneling from the valence band of the drain to the conduction band of the channel, and for an NMOS device the source/drain spacer material inhibits tunneling from the conduction band of the drain to the valence band of the channel. For example, in PMOS devices, the source/drain spacers comprise a semiconductor material that provides a relatively high CBO and a relatively low VBO. So, for instance, in some embodiments the semiconductor spacer material for a PMOS device provides a CBO of 0.1 eV or greater (e.g., ≥150 meV, or ≥180 meV, or ≥200 meV) while simultaneously providing a VBO of less than 50 meV (e.g., −0.045 to 0.045 meV, or −0.035 to 0.035 meV, or −0.025 to 0.025 meV, or −0.015 to 0.015 meV, or −0.01 to 0.01 meV). On the other hand, for NMOS devices, the source/drain spacers comprise a semiconductor material that provides a relatively low CBO and a relatively high VBO. So, for instance, in some embodiments the semiconductor spacer material for an NMOS device provides a VBO of 0.1 eV or greater (e.g., ≥150 meV, or ≥180 meV, or ≥200 meV) while simultaneously providing a CBO of less than 50 meV (e.g., −0.045 to 0.045 meV, or −0.035 to 0.035 meV, or −0.025 to 0.025 meV, or −0.015 to 0.015 meV, or −0.01 to 0.01 meV). Such selection criteria provide a desirable band structure.

Note that such band properties can be temperature dependent, and therefore can be measured at an appropriate temperature as will be appreciated. In some embodiments, for instance, the band properties discussed herein are measured at a temperature in the range of about 300 Kelvin (K), so about 300+/−5 K (e.g., 300 K or 302 K). Appropriate measurement temperature can vary from embodiment to the embodiment, and the present disclosure is not intended to be limited by temperature. As will be further appreciated, offsets may be scaled based on the measurement temperature.

In some example cases, the source/drain spacer material is the same as the heavily-doped source/drain material (e.g., dopant concentration in excess of 1E18 $cm^3$), except that the source/drain spacer material is undoped or only lightly-doped (e.g., dopant concentration of less 1E18 $cm^3$). For instance, in one such example embodiment having a germanium channel region, boron-doped silicon germanium carbon (b-doped SiGe:C) is used for the heavily-doped source/drain material, and the same SiGe:C compound is used in an undoped/lightly-doped state (no or relatively low boron concentration) for the source/drain spacers. In some such cases, the germanium concentration is in the range of 80 to 90 atomic percent. In other example cases, the heavily-doped source/drain material is compositionally distinct from the source/drain spacer material (i.e., beyond just being differently doped). For example, in one such embodiment having a germanium channel region, boron-doped germanium is used for the heavily-doped source/drain material, and undoped/lightly-doped SiGe:C having a germanium concentration in the range of 80 to 90 atomic percent is used for the source/drain spacers. Note that the carbon is included with a colon because it is a relatively small amount, relative to the silicon and germanium (e.g., 4 atomic percent or less). To this end, the colon could be left out as well (SiGeC).

As previously noted, the source/drain spacers are either undoped or lightly-doped, relative to the highly-doped source/drain regions. A highly-doped source/drain material may be, for example, a p-doped semiconductor having a germanium concentration in range of 80 to 100 atomic percent and a boron concentration in excess of 1E18 $cm^3$ or 1E20 $cm^3$ or 1E21 $cm^3$ or 2E21 $cm^3$, according to some embodiments. In contrast, an undoped or lightly-doped source/drain spacer material may be, for example, p-doped SiGe:C having a germanium concentration in the range of 80 to 90 atomic percent and a boron concentration of less than 1E18 $cm^3$ or 1E17 $cm^3$ or 1E16 $cm^3$, according to some embodiments. Similar dopant concentration can be applied to n-doped transistor devices as well. As will be appreciated in light of this disclosure, any number of materials and doping schemes can be used in conjunction with source/drain spacers that meet the selection criteria as variously provided herein with respect to band structure.

As will be further appreciated, the concentrations of the elements making up the spacer can vary from one embodiment to the next. For instance, in some embodiments having source/drain spacers comprising SiGe:C, those spacers include 10 to 16 atomic percent silicon, 80 to 90 atomic percent germanium, and 1 to 4 atomic percent carbon. In a more general sense, a PMOS transistor configuration having a germanium channel according to an embodiment herein can be implemented with any material system arranged to provide a highly-doped semiconductor source/drain region in conjunction with an undoped/lightly-doped source/drain semiconductor spacer material that provides a CBO of 0.1 eV or greater and a VBO of less than 0.04 eV (e.g., −0.04 eV<VBO<+0.04 eV). Note that these offsets (CBO and VBO) of the source/drain spacer are relative to the channel region. In any such PMOS cases, the high CBO of the selected source/drain semiconductor spacer material provides an increased energy gap at the channel/drain boundary which reduces or prevents BTBT, while the low VBO ensures that the extrinsic resistance of the device remains low, as will be explained herein. In a similar fashion, an NMOS transistor configuration having a germanium or group III-V material channel according to an embodiment herein can be implemented with any material system arranged to provide a highly-doped semiconductor source/drain region in conjunction with a undoped/lightly-doped semiconductor source/drain spacer material that provides a VBO of 0.1 eV or greater and a CBO of less than 0.04 eV (e.g., 0.0 eV+/−0.04 eV). In any such NMOS cases, the high VBO of the selected source/drain semiconductor spacer material provides an increased energy gap at the channel/drain boundary which reduces or prevents BTBT, while the low CBO ensures that the extrinsic resistance of the device remains low, as will be explained herein.

In accordance with an embodiment, a methodology to implement these techniques includes forming a semiconductor body and a gate structure at least on that semiconductor body, thereby defining a channel region in the body underneath the gate structure. The semiconductor body can be planar or non-planar (e.g., FinFET or nanowire channel configuration), and in some embodiments is germanium. The gate structure is disposed at least above the semiconductor body (in planar devices), but may further be disposed on opposing sidewalls of the semiconductor body (in FinFET devices) or completely surrounding the semiconductor body (in nanowire devices). The gate structure includes a gate dielectric, gate electrode, and gate spacers, and may be implemented in a gate-first or gate-last process. Note that the gate dielectric may include a high-k gate dielectric, in some embodiments. The method further includes etching source and drain recesses adjacent to the gate structure, such that the source/drain recesses undercut the gate structure. Thus, each source/drain recess extends vertically down into the substrate or semiconductor body upon which it is being formed as well as laterally underneath the gate spacers and gate electrode (and gate dielectric). The undoped/lightly-doped source/drain semiconductor spacer (S/D spacer) material is then deposited into the source/drain recesses, at least proximate the channel region, followed by a deposition of heavily-doped source/drain material. Note this deposition process can be a continuous process where the dopant concentration is graded or stepped from about zero during the S/D spacer portion of the deposition to in excess of say 1E18 $cm^3$ for the bulk of the highly-doped S/D portion. As will be further appreciated, the thickness of the S/D spacer material deposition can vary, but in some embodiments is in the range of 3 nm to 50 nm (e.g., 5 to 30 nm, or 5 to 25 nm, or 5 to 20 nm, or 3 to 10 nm). In some such cases, the thickness of the S/D spacer material deposition makes up about 25% or less of the overall thickness of the total S/D structure (the overall thickness including the undoped/lightly-doped S/D spacer and the highly-doped source/drain portion), and the highly-doped S/D material makes up about 50% to 95% of the overall thickness of the S/D structure. Further note that the highly-doped S/D material deposition may be used to form so-called raised S/D regions, such that the S/D regions extend beyond (above) the recess opening and are taller than the channel region therebetween. In addition, recall that, for PMOS transistor devices, the S/D spacer semiconductor material is selected to provide a relatively high CBO (e.g., exceeding 150 or 180 mEV) and a relatively low VBO (e.g., 0 eV, +/−0.025 eV), and for NMOS transistor devices, the S/D spacer semiconductor material is selected to provide a relatively high VBO (e.g., exceeding 150 or 180 mEV) and a relatively low CBO (e.g., 0 eV, +/−0.025 eV). Numerous PMOS and NMOS transistor structures meeting these criteria can be formed.

Architecture

The transistor structures provided herein can be implemented with any number of material systems that meet the criteria provided herein with respect to the channel and source and/or drain materials. In some embodiments the channel and source and/or drain materials are group IV semiconductor materials (e.g., silicon, germanium, SiGe, SiGe:C), while in other embodiments the channel and source and/or drain materials are group III-V semiconductor materials (e.g., indium aluminum arsenide—InAlAs, indium arsenic phosphide—InAsP, indium gallium phosphide—InGaAsP, gallium antimonide—GaSb, gallium aluminum antimonide—GaAlSb, indium gallium antimonide—InGaSb, indium gallium phosphorus antimonide—InGaPSb, indium gallium antimonide—InGaSb, indium gallium arsenide—InGaAs, and indium arsenide—InAs, or other group III-V semiconductor materials or compounds). FIGS. 1a-b, 2a-b, 3a-b and Table 1 illustrate various example group IV semiconductor embodiments, and FIG. 3c and Table 2 illustrate various example group III-V semiconductor embodiments.

Figure 1B:
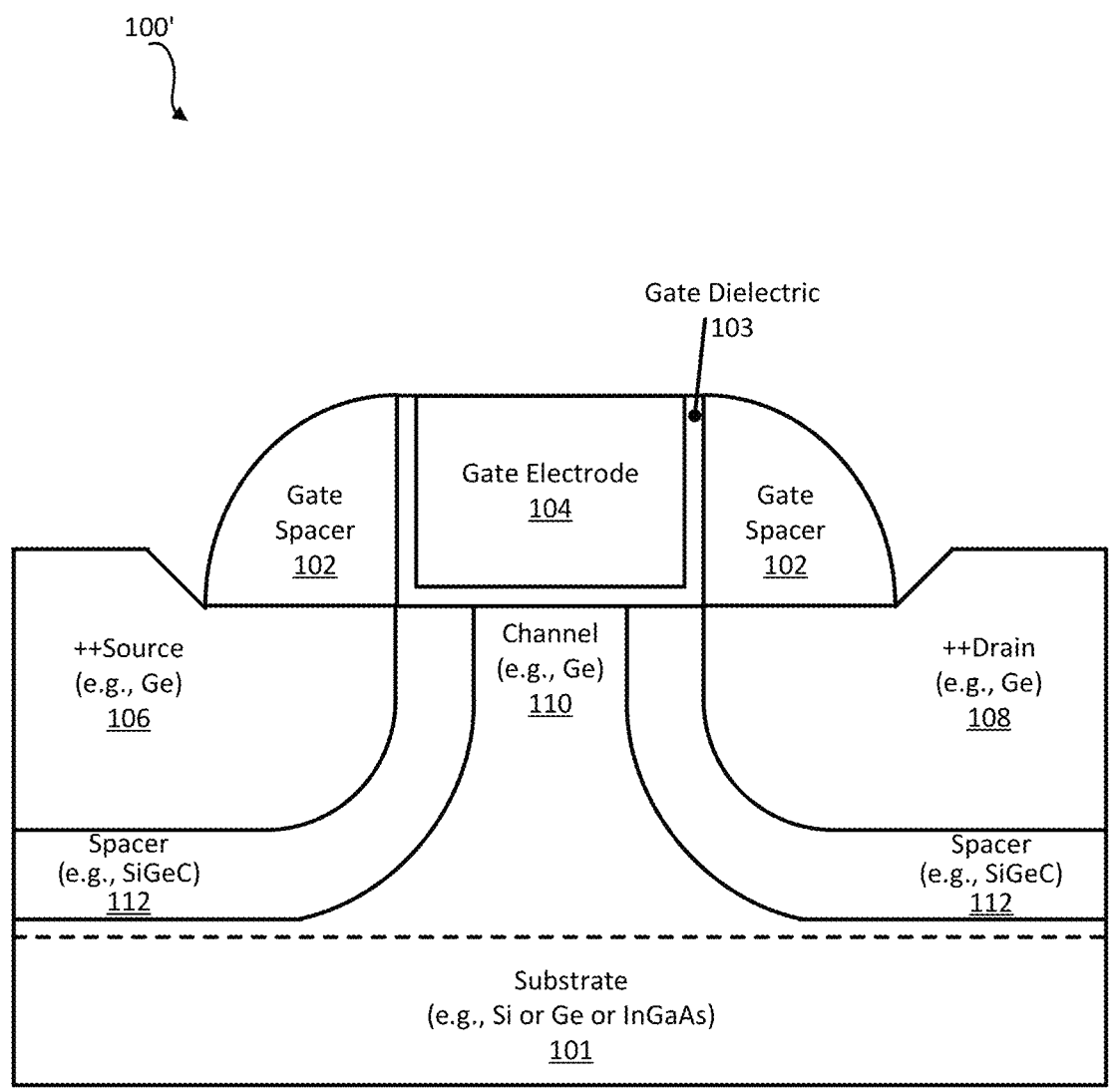

FIGS. 1a and 1b each illustrates an example cross-sectional view of an integrated circuit transistor structure, in accordance with certain embodiments of the present disclosure. As can be seen, each of the example structures 100 and 100' shows a PMOS transistor device that includes a semiconductor substrate 101 and a semiconductor body that includes channel region 110. A gate stack or structure is formed over the channel region 110 and includes a gate dielectric 103 and a gate electrode 104. In addition, gate spacers 102 are provided to either side of the gate stack. As can be further seen, a source recess has been filled with a combination of an undoped/lightly-doped source/drain spacer 112 and a highly-doped source region 106, and a drain recess has been filled with a combination of an undoped/lightly-doped source/drain spacer 112 and a highly-doped drain region 108. Other transistor features, such as the source and drain contacts and insulator fill material, local interconnect, and interconnect/metal layers, are not shown but will be readily apparent in light of this disclosure. As will be further appreciated in light of this disclosure, the spacers 112 operate in conjunction with the source region 106 and the drain region 108 to provide an overall band structure or scheme (with respect to the channel region) configured to reduce band-to-band tunneling without adversely affecting the extrinsic resistance of the transistor structure 100 or 100'. As will be further appreciated, note that the cross-section shown may be either a planar channel architecture or a non-planar channel architecture. For instance, for a non-planar fin-based or nanowire channel structure, the cross-section shown is taken through and parallel to the fin/semiconductor body (and perpendicular to the gate). Due to the nature of the cross-section, the multiple sides of the gate structure about the non-planar semiconductor fin/body cannot be seen, but again will be readily apparent to those skilled in the art.

The substrate 101 can be any suitable semiconductor substrate, such as a bulk silicon, or bulk germanium or bulk group III-V material (e.g., indium gallium arsenide—InGaAs, or gallium arsenide—GaAs) substrate. Alternatively, the substrate 101 may be a multilayer structure, such as a semiconductor-on-insulator configuration (e.g., germanium-on-oxide, or GaAs-on-oxide), or a first semiconductor layer (e.g., germanium) on a second semiconductor layer (e.g., silicon or SiGe layer). In a more general sense, any number of substrate configurations can be used, and the present disclosure is not intended to be limited to any particular type.

Note that the channel region 110 may be native to the substrate 101 (i.e., the channel region 110 is made from and part of the substrate 101), but may also be compositionally different from the underlying substrate (e.g., a germanium fin or body 110 on an InGaAs substrate 101). This optional compositional difference is generally depicted in the figures as a dashed line between the channel region 110 and the substrate 101. In some such embodiments, the compositionally different semiconductor fin or body that will ultimately include channel region 110 is epitaxially grown from trenches after removal of sacrificial native fins, in a so-called aspect ratio trapping (ART) based fin forming process. Example ART-based semiconductor fin forming techniques are provided, for instance, in U.S. Patent Application Publication 2014/0027860. In some such ART-based cases, the replacement fin material is provided as alternating layers of desired channel material and sacrificial/inactive material such as described in U.S. Patent Application Publication 2016/0260802. Such multilayer fins are particularly useful for forming nanowire transistors (e.g., during final gate processing, prior to deposition of final gate materials). In some ART-based cases, a first set of fins or wires is formed with a first semiconductor material system (e.g., for p-type devices), and a second set of fins or wires is formed with a second semiconductor material system (e.g., for n-type devices). Any number of fin forming processes can be used in the context of the present disclosure, so long as a suitable band structure as variously described herein can be provisioned so as to mitigate or otherwise reduce band-to-band tunneling.

The gate structure can be implemented with any suitable processes and materials. For instance, the gate structure may have been formed during a replacement metal gate process (or so-called gate-last process) where dummy gate materials are initially provisioned and then removed later in the process to make way for the final gate materials. Alternatively, the gate structure can be formed during a so-called gate-first process where the desired final gate materials are provided earlier in the process. In the embodiment shown, the gate dielectric 103 is provided between the gate spacers 102 and gate electrode 104, so as to provide a u-shape in the cross-section shown. In other embodiments, however, the gate dielectric is only between the gate electrode 104 and the channel region 110, such that the gate spacers may be in direct contact with opposing sidewalls of the gate electrode 104. The gate stack may further include a hard mask on top of the gate electrode (and any exposed gate dielectric). Any number of gate stack configurations can be used.

The gate spacers 102 may be, for example, silicon nitride or silicon dioxide. The gate dielectric 103 may be, for example, any suitable gate dielectric material such as silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric 103 to improve its quality when a high-k material is used. Further, the gate electrode 104 may comprise a wide range of materials, such as polysilicon, silicon nitride, silicon carbide, or various suitable metals or metal alloys, such as aluminum, tungsten, titanium, tantalum, copper, titanium nitride, or tantalum nitride, for example.

In some embodiments, the gate dielectric and/or gate electrode may include a multilayer structure of two or more material layers or components. For instance, in one such embodiment, the gate dielectric is a bi-layer structure having a first dielectric material (e.g., silicon dioxide) in contact with the channel region and a second dielectric material (e.g., hafnium oxide) in contact with the first dielectric material, the first dielectric material having a dielectric constant that is lower than the dielectric constant of the second dielectric material. Likewise, the gate electrode structure may include a central metal plug portion (e.g., tungsten) with one or more outer work function layers and/or barrier layers (e.g., tantalum, tantalum nitride), and/or a resistance reducing cap layer (e.g., copper, gold). In some embodiments, the gate dielectric and/or gate electrode may include grading (increasing or decreasing, as the case may be) of the concentration of one or more materials therein. Numerous different gate structure configurations can be used, as will be apparent in light of this disclosure.

In some embodiments fabricated using a gate-last process, the source/drain recesses are formed adjacent the channel region 110, after a dummy gate stack is provided (e.g., polysilicon gate electrode 104, silicon dioxide gate dielectric 103, and silicon nitride gate spacers 102). In other embodiments having a gate-first process, however, the source/drain recesses may be formed adjacent the channel region, after that final gate stack is provided (e.g., tungsten gate electrode 104, hafnium dioxide gate dielectric 103, and silicon nitride gate spacers 102). In any case, note that the source drain recesses undercut the gate structure, such that the recesses extend under the gate spacers 102 as well as the gate electrode 104. Any suitable etch can be used, including wet and/or dry etches, isotropic and/or anisotropic etches, and selective etch schemes. The degree of the undercut will vary from one embodiment to the next, depending on factors such as the desired distance between the source recess and the drain recess (or lateral length of channel region 110) as well as the desired thickness of the spacer layers 112. In some cases, the thickness of the source layers 112 is less than 20% of the overall thickness of the source/drain structure (i.e. combined thickness of 112 and 106 for the source structure, and 112 and 108 for the drain structure), or less than 15%, or less than 10%, or less than 5%. Further note that, while the recesses shown in FIGS. 1a-1b provide a rounded profile proximate the channel region, other embodiments may provide more faceted or angular source/drain recesses, depending on factors such as the crystal orientation of the channel material and the etch process employed, as will be appreciated.

The source/drain spacers 112 are deposited into the recesses first (prior to the heavily-doped source/drain regions 106/108), so as to effectively provide a BTBT inhibiter between the channel region 110 and the respective source region 106 and drain region 108. As previously explained, the spacers 112 comprise a semiconductor material selected to effectively increase the band offset for the target carriers (i.e., either holes for PMOS devices or electrons for NMOS devices). So, for PMOS devices like this example embodiment, the spacer 112 material selected has a relatively high CBO and a zero or otherwise relatively low VBO. As will be appreciated, these offsets (CBO and VBO) of the spacer 112 are relative to the channel region 110. In an embodiment, the spacer material has a bandgap that is greater than the bandgap of the channel material. In any such cases, the spacer 112 material selected may also be amenable to doping to provide a desired level of conductivity and/or polarity, particularly in embodiments where that same material is used in the heavily-doped source/drain regions 106/108.

In some embodiments, the source/drain semiconductor spacer material is selected for a PMOS device such that the CBO exceeds a threshold value of at least 150 millielectronvolts (meV) or at least 180 meV, and the VBO is less than a threshold value of 20 meV or less than 10 meV or less than 5 meV (or otherwise relatively close to 0 meV). In some such embodiments having a germanium channel region, the selected semiconductor material for the spacer 112 is silicon-germanium-carbon (SiGe:C), although other semiconductor materials that exhibit the aforementioned desired characteristics may also be used. In some such embodiments, the selected semiconductor spacer material composition may be one of, or otherwise comparable to, the following: $Si_{0.16}Ge_{0.80}C_{0.04}$, $Si_{0.15}Ge_{0.83}C_{0.02}$, $Si_{0.14}Ge_{0.85}C_{0.01}$, $Si_{0.13}Ge_{0.85}C_{0.02}$, $Si_{0.11}Ge_{0.88}C_{0.01}$, or $Si_{0.10}Ge_{0.89}C_{0.01}$. Other example embodiments will be apparent such as any of those having a germanium concentration in the range of about 80 to 90 atomic percent, a silicon concentration in the range of about 10 to 16 atomic percent, and a carbon concentration in the range of about 1 to 4 atomic percent.

In some such embodiments having SiGe:C spacers 112, the channel can be, for example, bulk germanium (undoped/lightly-doped), and the source/drain regions 106/108 are boron-doped germanium or SiGe or SiGe:C having a germanium concentration that is different from the spacers 112.

The underlying substrate can be any number of materials, such as silicon, Ge, SiGe, or InGaAs, to name a few examples. In embodiments of this first example, as illustrated in FIG. 1a, the spacers 112 are either undoped or relatively lightly-doped in comparison to the source region 106 and drain region 108, which are relatively more heavily-doped. If doped at all, the doping of the spacers 112 may be, for example, one or more orders of magnitude lower than the heavily-doped source drain regions 106 and 108.

As shown in the example embodiment of FIG. 1a, the spacers 112, are disposed under the gate electrode 104. Note that the spacers 112 need not align to the gate spacer 102. In FIG. 1b, however, the spacers 112 are aligned to the gate spacer 102. Such alignment is not needed; rather, any degree overlap between the source/drain spacers 112 and the gate electrode 104 and/or gate dielectric 103 can help mitigate BTBT. In embodiments where the gate dielectric 103 is also disposed on sidewalls of the gate 104, the spacers 112 may only be under the gate dielectric 103. The distance of the overlap can vary from embodiment to embodiment, but in some cases is in the range of 0.1 nm to 5 nm of overlap between the gate electrode 104 and/or gate dielectric 103 and each source/drain spacer 112. Note that, because the source/drain spacers 112 under the gate electrode 104 and/or gate dielectric 103 are lightly doped or undoped, most of the band bending will happen in the lightly/undoped regions and it is desired that the band bending occur in the region with high offsets.

FIG. 1a' shows alternate embodiments to any of the embodiments provided herein, although shown in the context of FIG. 1a. In particular, note that both the source and drain regions need not have a spacer as provided herein; rather, in some embodiments only the source region includes the spacer and the drain region is a regular drain structure, while in other embodiments only the drain region includes the spacer and the source region is a regular source structure. The same alternate embodiments can be applied to any of the embodiments discussed herein with respect to FIGS. 1b, 2a-b, and 3a-c, as well as the example methodology of FIG. 5.

Figure 2A:
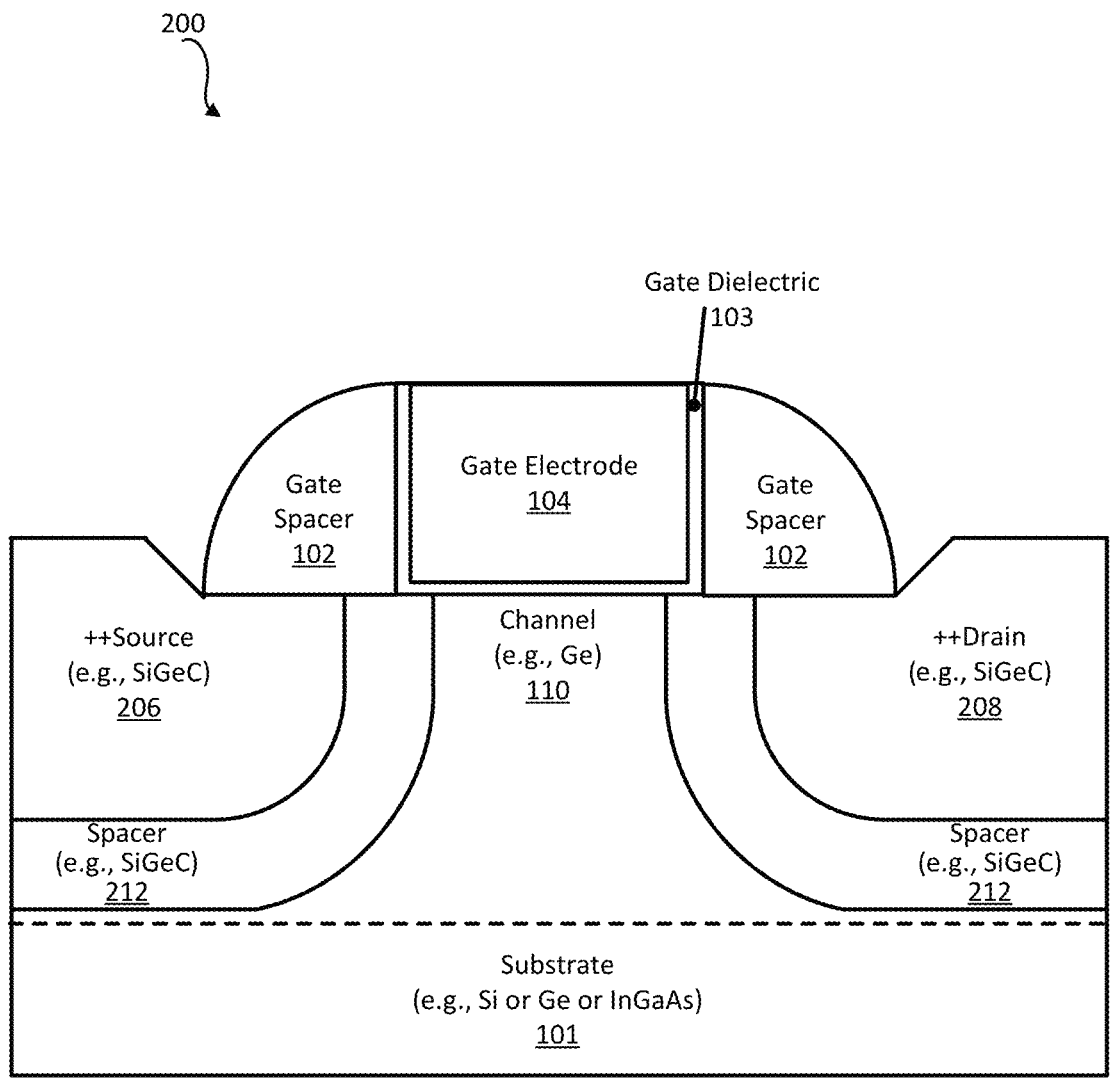
FIGS. 2a-2b each illustrates an example cross-sectional view of another integrated circuit transistor structure, configured in accordance with certain other embodiments of the present disclosure.
Figure 2B:
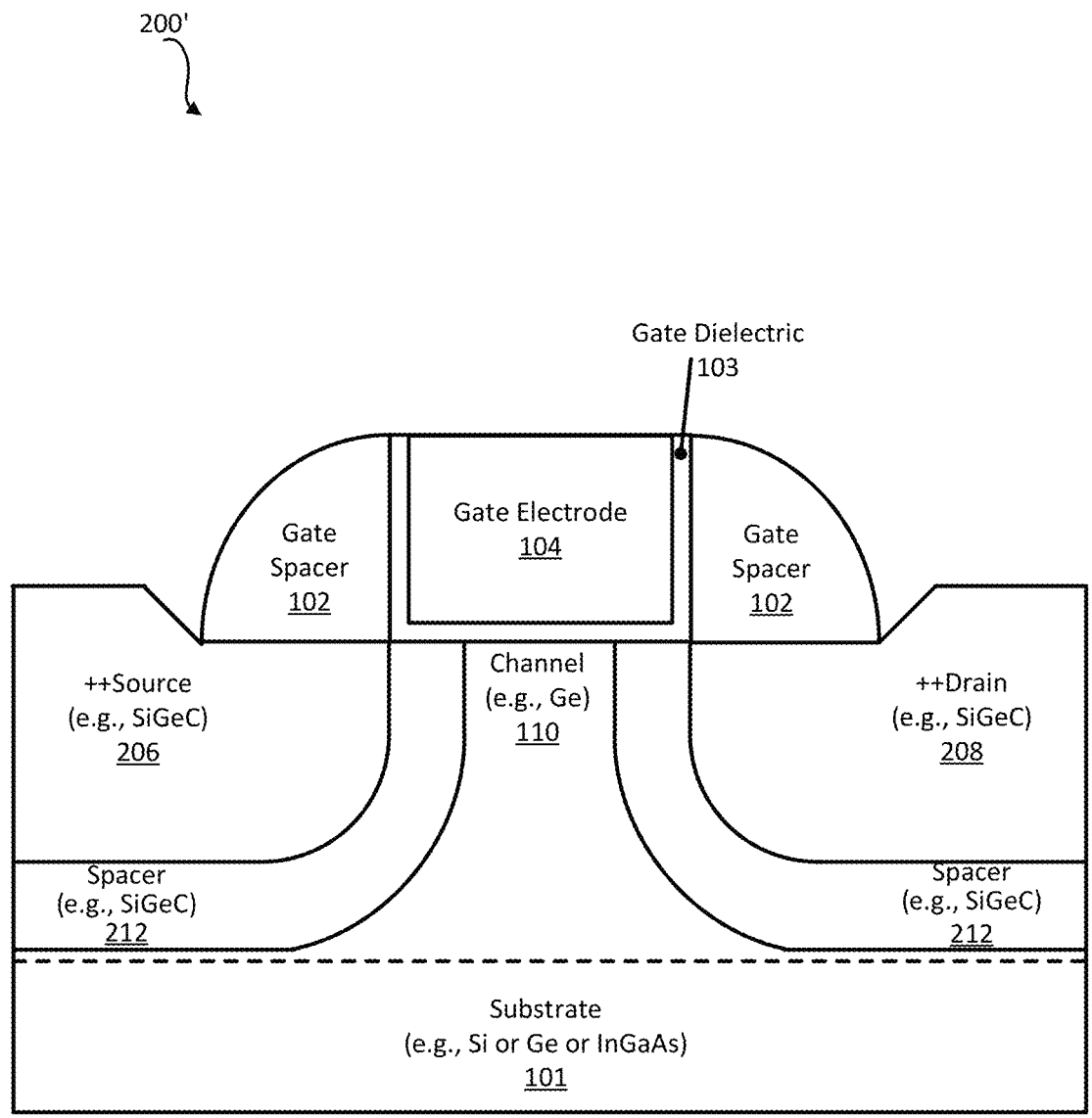

FIGS. 2a and 2b each illustrates an example cross-sectional view of another integrated circuit transistor structure, in accordance with certain embodiments of the present disclosure. As can be seen, the structures 200 and 200' are similar to the structures 100 and 100', respectively, except that the highly-doped source and drain regions 206/208 are formed from the same semiconductor material selected for the undoped/lightly-doped spacers 212 (same semiconductor composition, but not counting the dopant concentration). So for example, for purposes of this particular discussion, undoped/lightly-doped SiGe:C and heavily-doped SiGe:C having the same germanium-silicon-carbon concentrations may be considered compositionally the same despite having different boron concentrations, while undoped/lightly-doped SiGe:C and heavily-doped SiGe are compositionally different. Regarding the similarities between FIGS. 1a-b and 2a-b, the previous relevant discussion with respect to the gate structure (including gate electrode 104, gate dielectric 103, and gate spacers 102), channel region 110, and substrate 101 is equally applicable here.

In some such example embodiments, both the source/drain spacers 212 and the source/drain regions 206/208 are formed from SiGe:C for PMOS devices. However, the source/drain regions 206/208 are heavily-doped SiGe:C relative to the undoped/lightly-doped SiGe:C spacer 212. As previously explained, the spacers 212 are deployed to separate the source region 206 and drain region 208 from the channel region 110 to inhibit BTBT. In an embodiment, the spacer material has a bandgap that is greater than the bandgap of the channel material (or simply, channel bandgap).

As shown in the example embodiment of FIG. 2a, the source/drain spacers 212, are disposed under the gate electrode 204, but do not need to align with the gate spacers 202. Just as explained with respect to FIGS. 1a-b, the source/drain spacers 212 need not align to gate spacers 202. In the example embodiment of FIG. 2b, source/drain spacers 212 are aligned to gate spacer 202. The previous relevant discussion with respect to the degree of overlap between the source/drain spacers 112 and gate electrode 104 and/or gate dielectric 103 is equally applicable here.

Figure 3A:
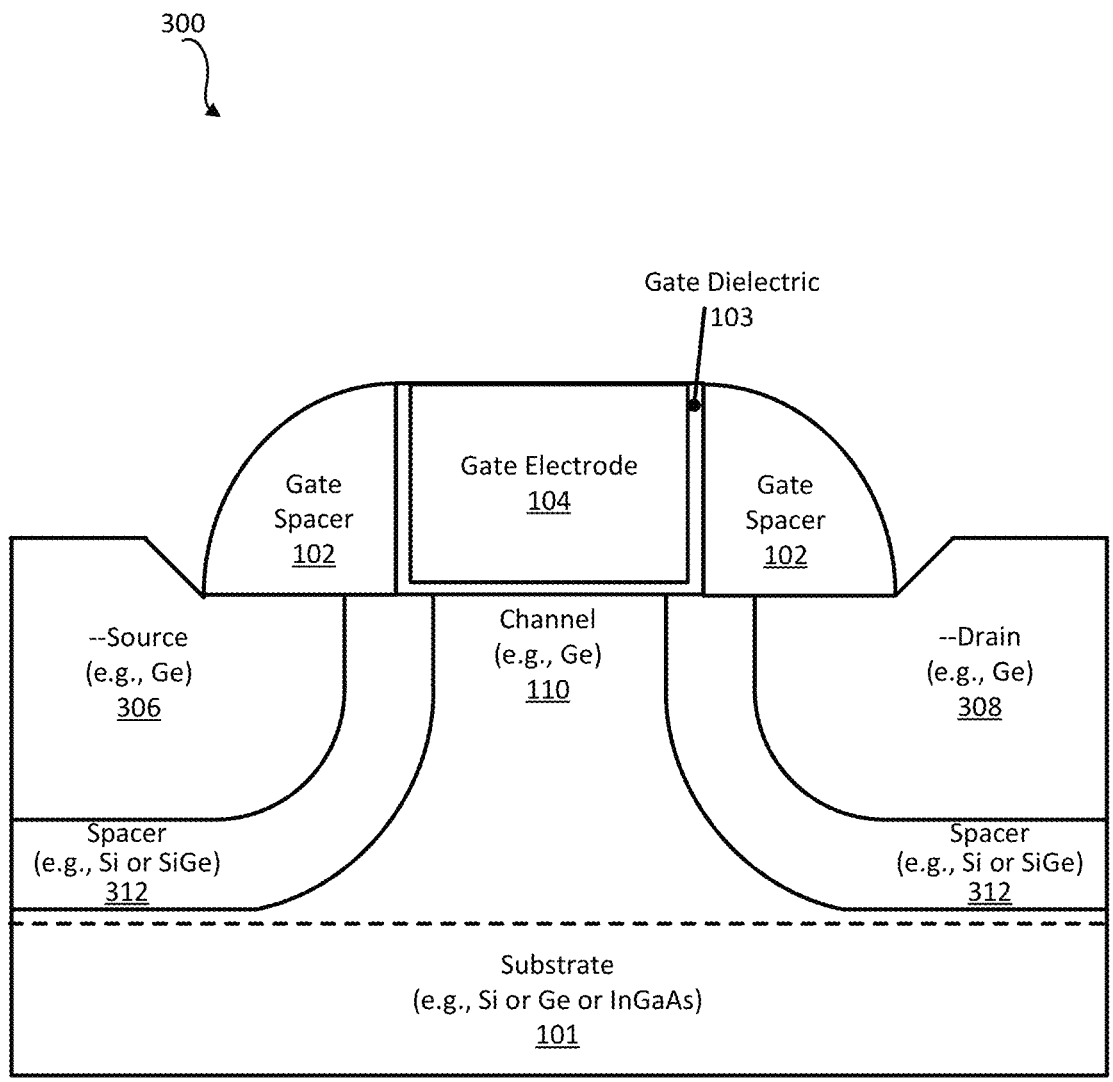
FIGS. 3a-3c each illustrates an example cross-sectional view of another integrated circuit transistor structure, configured in accordance with certain other embodiments of the present disclosure.
Figure 3B:
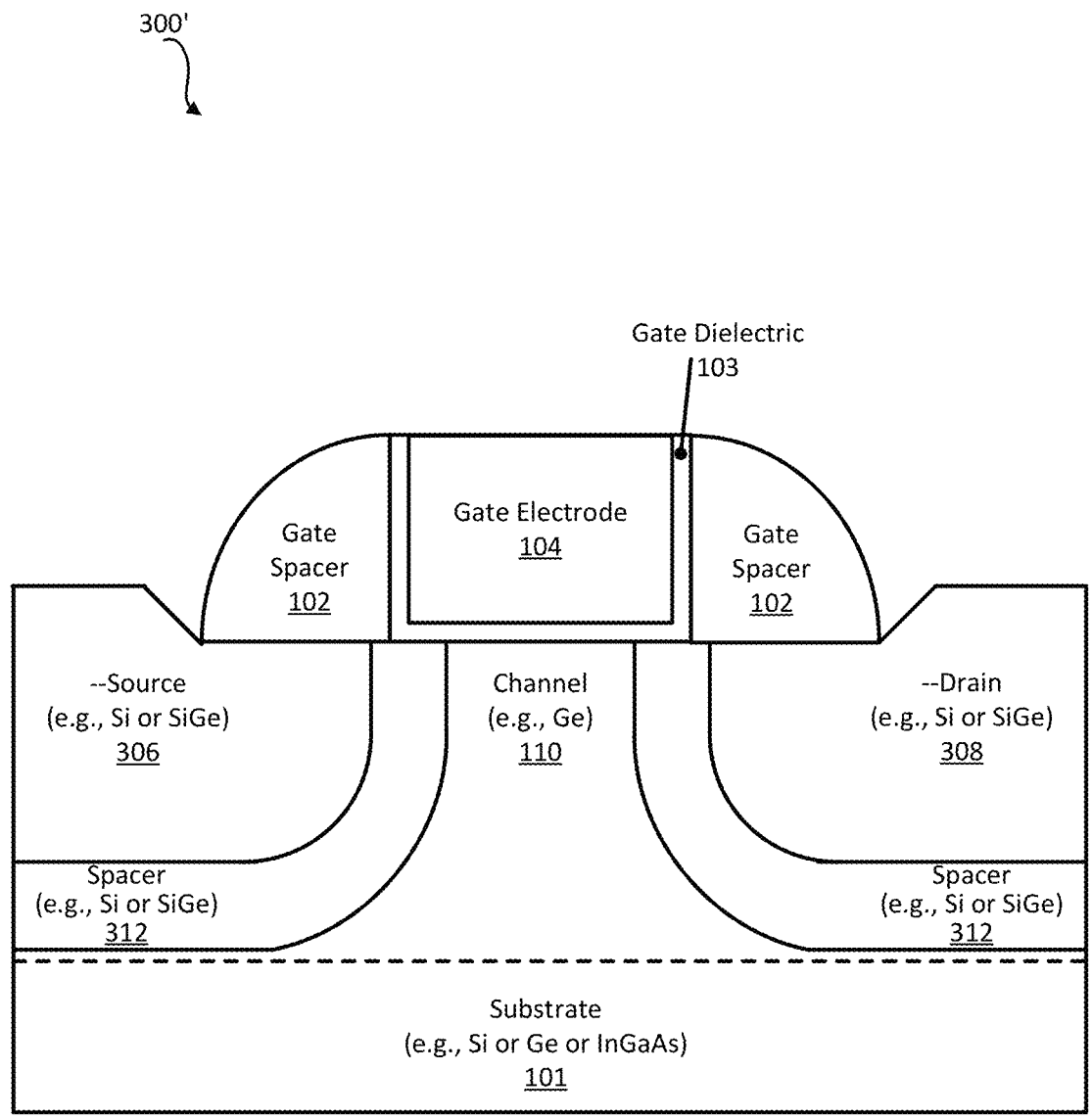

FIGS. 3a and 3b each illustrates an example cross-sectional view of an integrated circuit transistor structure, in accordance with still other embodiments of the present disclosure. As can be seen, each of the example structures 300 and 300' shows a NMOS transistor device that includes a semiconductor substrate 101 and a semiconductor body that includes channel region 110. A gate stack or structure is formed over the channel region 110 and includes a gate dielectric 103 and a gate electrode 104. In addition, gate spacers 102 are provided to either side of the gate stack. As can be further seen, a source recess has been filled with a combination of an undoped/lightly-doped source/drain spacer 312 and a highly-doped source region 306, and a drain recess has been filled with a combination of an undoped/lightly-doped source/drain spacer 312 and a highly-doped drain region 308. Regarding the similarities between FIGS. 1a-b and 3a-b, the previous relevant discussion with respect to the gate structure (including gate electrode 104, gate dielectric 103, and gate spacers 102), channel region 110, and substrate 101 is equally applicable here.

The source/drain spacers 312 are deposited into the recesses first, so as to effectively provide a BTBT inhibiter between the channel region 110 and the respective source region 306 and drain region 308. As previously explained, the spacers 312 comprise a semiconductor material selected to effectively increase the band offset for the target carriers (i.e., either holes for PMOS devices or electrons for NMOS devices). So, for NMOS devices such as this example embodiment, the spacer 312 material selected has a relatively high VBO and a zero or otherwise relatively low CBO. As will be appreciated, these offsets (CBO and VBO) of the spacer 312 are relative to the channel region 110. In an embodiment, the spacer material has a bandgap that is greater than the bandgap of the channel material. In any such cases, the spacer 312 material selected may also be amenable to doping to provide a desired level of conductivity and/or polarity, particularly in embodiments where that same material is used in the heavily-doped source/drain regions 306/308.

In some embodiments, the source/drain semiconductor spacer material is selected for an NMOS device such that the VBO exceeds a threshold value of at least 150 milli-electronvolts (meV) or at least 180 meV, and the CBO is less than a threshold value of 10 meV or less than 5 meV (or otherwise relatively close to 0 meV). In some such embodiments having a germanium channel region, the selected semiconductor material for the spacer 312 is silicon germanium (SiGe) or silicon, although other semiconductor materials that exhibit the aforementioned desired characteristics may also be used. In some such embodiments, the selected semiconductor spacer 312 material composition may be one of, or otherwise comparable to, the following: $Si_{0.80}Ge_{0.20}$, $Si_{0.85}Ge_{0.15}$, $Si_{0.87}Ge_{0.13}$, or $Si_{0.90}Ge_{0.10}$. Other example embodiments will be apparent such as any of those having a silicon concentration in the range of about 80 to 90 atomic percent, and a germanium concentration in the range of about 10 to 20 atomic percent. In still other embodiments, the source/drain spacers 312 can be all silicon. In some such embodiments having undoped or lightly-doped SiGe or silicon spacers 312, the channel can be, for example, bulk germanium (undoped/lightly-doped), and the heavily-doped source/drain regions 306/308 are phosphorus-doped germanium as shown in the example embodiment of FIG. 3a. In other such example embodiments, the heavily-doped source/drain regions 306/308 are the same materials as the source/drain spacer 312 (except for the doping, as will be appreciated), as shown in FIG. 3b.

Table 1 illustrates a number of specific example embodiments for both PMOS and NMOS configurations, using Group IV semiconductor material systems including silicon and germanium. As will be appreciated with respect to Table 1, polarity doping for p-type source/drain regions (PMOS devices) is indicated as the first component in a given material followed by a colon. For instance, example p-type dopants for group IV source/drain materials include boron, gallium, and aluminum, to name a few types. So, for example, a boron-doped germanium source or drain region is represented as B:Ge, and a lightly-doped boron SiGe:C source spacer or drain spacer is represented as B:SiGe:C. Likewise, example n-type dopants for group IV source/drain materials (NMOS devices) include phosphorus, arsenic, and antimony, to name a few types. So, for example, a phosphorus-doped silicon source or drain region is represented as P:Si, and a lightly-doped phosphorus SiGe:C source spacer or drain spacer is represented as P:SiGe:C. As will be further appreciated with respect to Table 1, although the channel is indicated as undoped in each of the examples, in still other embodiments the channel of any of these examples may be lightly-doped (either p-type or n-type, depending on factors such as desired performance, transistor type, and mode of operation). Also, if the atomic percentage of a given component of a semiconductor material is provided as a range, then expressly stated example embodiments include compounds/alloys having any weight value within that given range. For example, a source/drain spacer $Si_xGe_y:C_z$ wherein $8 \leq x \leq 16$, $80 \leq y \leq 90$, and $1 \leq z \leq 4$, then various example embodiments include any SiGe:C alloy that is fully represented (not including dopant, if present, to provide n-type/p-type polarity) by: any first atomic percentage of silicon in the range of 8 to 16 atomic percent, any second atomic percentage of germanium in the range of 80 to 90 atomic percent, and any third atomic percentage of carbon in the range of 1 to 4 atomic percent, wherein the first, second, and third atomic percentages equal 100 percent. Numerous variations in material systems and alternative embodiments will be appreciated in light of this disclosure.

TABLE 1

Example Group IV Material Systems to Reduce BTBT

| PMOS NMOS | S/D Spacer | S/D Region | Channel | Notes |
|---|---|---|---|---|
| PMOS | $Si_xGe_y:C_z$ | B:Ge | Ge | Different composition for S/D spacer and S/D region. For example: $8 \leq x \leq 16$; $80 \leq y \leq 90$; $1 \leq z \leq 4$; $x + y + z = 100$; Also, S/D spacer is undoped, while S/D region is heavily-doped with boron (B). |
| PMOS | $B:Si_xGe_y:C_z$ | B:Ge | Ge | Different composition for S/D spacer and S/D region. For example: $8 \leq x \leq 16$; $80 \leq y \leq 90$; $1 \leq z \leq 4$; $x + y + z = 100$; Also, S/D spacer is lightly-doped with boron (B), while S/D region is heavily-doped with boron (B). |
| PMOS | $Si_xGe_y:C_z$ | $B:Si_{1-a}Ge_a$ | Ge | Different composition for S/D spacer and S/D region. For example: $8 \leq x \leq 16$; $80 \leq y \leq 90$; $1 \leq z \leq 4$; $x + y + z = 100$; $0.75 \leq a \leq 0.99$; Also, S/D spacer is undoped, while S/D region is heavily-doped with boron (B). |
| PMOS | $B:Si_xGe_y:C_z$ | $B:Si_{1-a}Ge_a$ | Ge | Different composition for S/D spacer and S/D region. For example: $8 \leq x \leq 16$; $80 \leq y \leq 90$; $1 \leq z \leq 4$; $x + y + z = 100$; $0.75 \leq a \leq 0.99$; Also, S/D spacer is lightly-doped with boron (B), while S/D region is heavily-doped with boron (B). |
| PMOS | $Si_xGe_y:C_z$ | $B:Si_xGe_y:C_z$ | Ge | Same composition for S/D spacer and S/D region. For example: $8 \leq x \leq 16$; $80 \leq y \leq 90$; $1 \leq z \leq 4$; $x + y + z = 100$; Also, S/D region is heavily-doped with boron (B) and S/D spacer is undoped. |

TABLE 1-continued

Example Group IV Material Systems to Reduce BTBT

| PMOS NMOS | S/D Spacer | S/D Region | Channel | Notes |
|---|---|---|---|---|
| PMOS | B:Si$_x$Ge$_y$:C$_z$ | B:Si$_x$Ge$_y$:C$_z$ | Ge | Same composition for S/D spacer and S/D region. For example: $8 \leq x \leq 16$; $80 \leq y \leq 90$; $1 \leq z \leq 4$; $x + y + z = 100$; Also, S/D spacer is lightly-doped with boron (B), while S/D region is heavily-doped with boron (B). |
| NMOS | Si$_x$Ge$_y$ | P:Si or P:Ge | Ge | Different composition for S/D spacer and S/D region. For example: $80 \leq x \leq 100$; $0 \leq y \leq 20$; $x + y = 100$; Also, S/D spacer is undoped, while S/D region is heavily-doped with phosphorus (P). |
| NMOS | P:Si$_x$Ge$_y$ | P:Si or P:Ge | Ge | Different composition for S/D spacer and S/D region. For example: $80 \leq x \leq 100$; $0 \leq y \leq 20$; $x + y = 100$; Also, S/D spacer is lightly-doped with phosphorus (P), while S/D region is heavily-doped with phosphorus (P). |
| NMOS | Si$_x$Ge$_y$ | P:Si$_a$Ge$_{1-a}$ | Ge | Different composition for S/D spacer and S/D region. For example: $80 \leq x \leq 100$; $0 \leq y \leq 20$; $x + y = 100$; $0.75 \leq a \leq 0.99$; Also, S/D spacer is undoped, while S/D region is heavily-doped with phosphorus (P). |
| NMOS | P:Si$_x$Ge$_y$ | P:Si$_a$Ge$_{1-a}$ | Ge | Different composition for S/D spacer and S/D region. For example: $80 \leq x \leq 100$; $0 \leq y \leq 20$; $x + y = 100$; $0.75 \leq a \leq 0.99$; Also, S/D spacer is lightly-doped with phosphorus (P), while S/D region is heavily-doped with phosphorus (P). |
| NMOS | Si$_x$Ge$_y$ | P:Si$_x$Ge$_y$ | Ge | Same composition for S/D spacer and S/D region. For example: $80 \leq x \leq 100$; $0 \leq y \leq 20$; $x + y = 100$; Also, S/D region is heavily-doped with phosphorus (P) and S/D spacer is undoped. |
| NMOS | P:Si$_x$Ge$_y$ | P:Si$_x$Ge$_y$ | Ge | Same composition for S/D spacer and S/D region. For example: $80 \leq x \leq 100$; $0 \leq y \leq 20$; $x + y = 100$; Also, S/D region is heavily-doped with phosphorus (P) and S/D spacer is lightly-doped with phosphorus (P). |

Figure 3C:
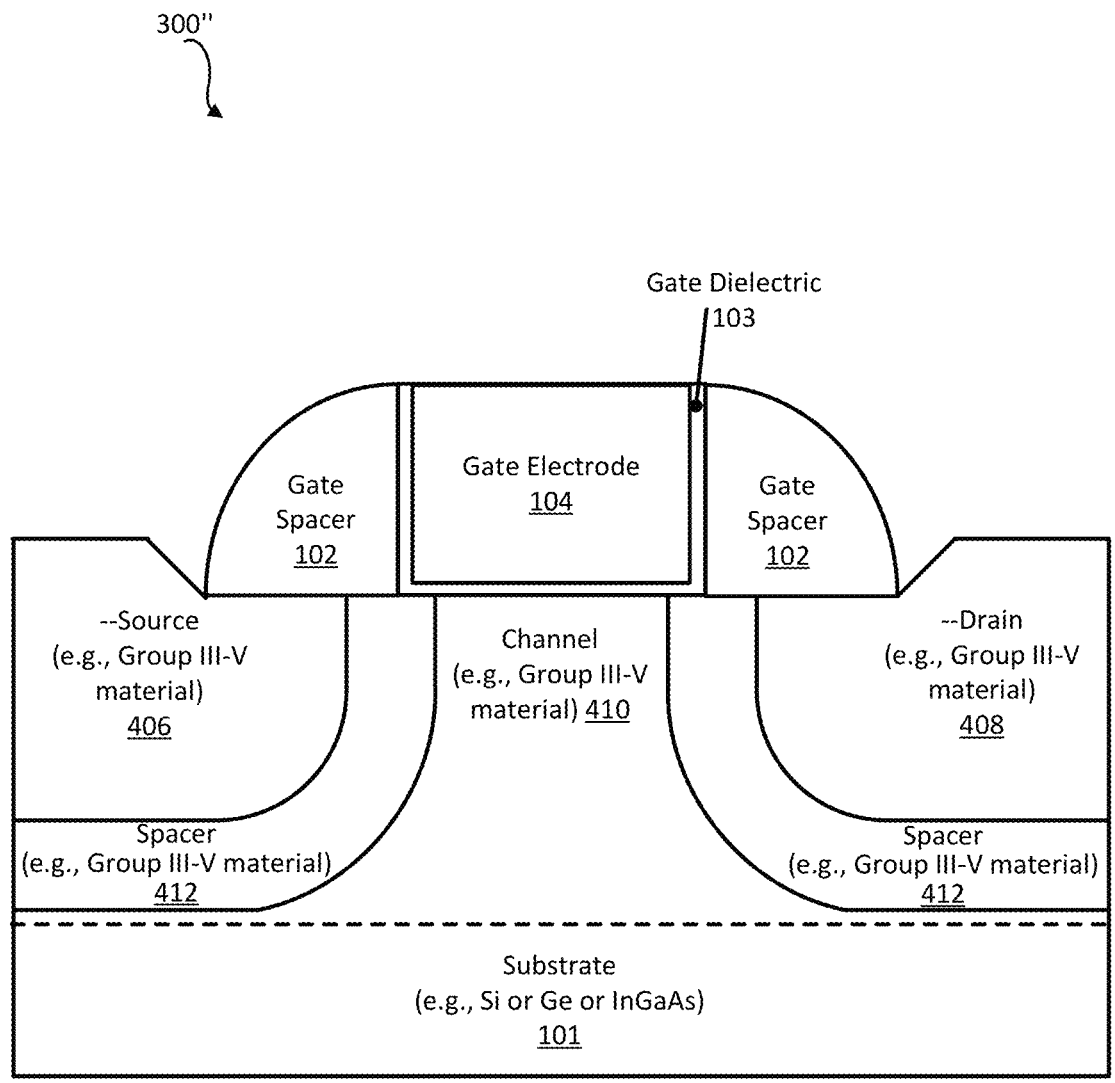

While FIGS. 1a through 3b refer to group IV semiconductor materials in the channel and source/drain regions, FIG. 3c refers to group III-V semiconductor materials in the channel and source/drain regions, in accordance with still other embodiments of the present disclosure. As can be seen, each of the example structure 300" shows a NMOS transistor device that includes a semiconductor substrate 101 and a semiconductor body that includes channel region 410. A gate stack or structure is formed over the channel region 410 and includes a gate dielectric 103 and a gate electrode 104. In addition, gate spacers 102 are provided to either side of the gate stack. As can be further seen, a source recess has been filled with a combination of an undoped/lightly-doped source/drain spacer 412 and a highly-doped source region 406, and a drain recess has been filled with a combination of an undoped/lightly-doped source/drain spacer 412 and a highly-doped drain region 408. Generally speaking, the previous relevant discussion with respect to the transistor components and BTBT mitigation is equally applicable here, as will be appreciated. In a more general sense, different materials that will be apparent in light of this disclosure can be used for any of the various transistor components depicted, and the present disclosure is not intended to be limited to just the specific example embodiments provided herein.

Table 2 illustrates a number of specific example embodiments for NMOS configurations, using Group IV semiconductor material systems including silicon and germanium. As will be appreciated with respect to Table 2, polarity doping for n-type or p-type source/drain regions is indicated as the first component in a given material followed by a colon, as explained with reference to Table 1. Example p-type dopants for group III-V source/drain materials include magnesium, beryllium, and carbon, and example n-type dopants for group III-V source/drain materials include silicon and tellurium. As will be further appreciated with respect to Table 2, although the channel is indicated as undoped in each of the examples, in still other embodiments the channel of any of these examples may be lightly-doped (either p-type or n-type, depending on factors such as desired performance, transistor type, and mode of operation). Also, if the atomic percentage of a given component of a semiconductor material is provided as a range, then expressly stated example embodiments include compounds/alloys having any weight value within that given range. For example, a source/drain spacer $In_yAl_{1-y}As$ wherein $0.60 \leq y \leq 1.00$, then various example embodiments include any InAlAs compound that is fully represented (not including dopant, if present, to provide n-type/p-type polarity) by: any first atomic percentage of indium in the range of 60 to 100 atomic; and any second atomic percentage of aluminum in the range of 0 to 40 atomic percent germanium, wherein the first and second atomic percentages equal 100 percent. Further note that 0 atomic percent implies that particular element is not in the compound. Numerous variations in material systems and alternative embodiments will be appreciated in light of this disclosure.

TABLE 2

Example Group III-V Material Systems to Reduce BTBT

| NMOS | S/D Spacer | S/D Region | Channel | Notes |
|---|---|---|---|---|
| NMOS | $In_yAl_{1-y}As$ | $Si:In_yAl_{1-y}As$ | $In_xGa_{1-x}As$ | Same or different composition for S/D spacer and S/D region. For example: $0.51 \leq x \leq 0.55$; $0.60 \leq y \leq 1.00$; Also, S/D spacer is undoped, while S/D region is heavily-doped with silicon (Si). |
| NMOS | $Si:In_yAl_{1-y}As$ | $Si:In_yAl_{1-y}As$ | $In_xGa_{1-x}As$ | Same or different composition for S/D spacer and S/D region. For example: $0.51 \leq x \leq 0.55$; $0.60 \leq y \leq 1.00$; Also, S/D spacer is lightly-doped with silicon (Si), while S/D region is heavily-doped with silicon (Si). |
| NMOS | $InAs_yP_{1-y}$ | $Si:InAS_yP_{1-y}$ | $In_xGa_{1-x}As$ | Same or different composition for S/D spacer and S/D region. For example: $0.51 \leq x \leq 0.55$; $0.10 \leq y \leq 1.00$; Also, S/D spacer is undoped, while S/D region is heavily-doped with silicon (Si). |
| NMOS | $Si:InAs_yP_{1-y}$ | $Si:InAs_yP_{1-y}$ | $In_xGa_{1-x}As$ | Same or different composition for S/D spacer and S/D region. For example: $0.51 \leq x \leq 0.55$; $0.10 \leq y \leq 1.00$; Also, S/D spacer is lightly-doped with silicon (Si), while S/D region is heavily-doped with silicon (Si). |
| NMOS | $In_yGa_{1-y}As_zP_{1-z}$ | $Si:In_yGa_{1-y}As_zP_{1-z}$ | $In_xGa_{1-x}As$ | Same or different composition for S/D spacer and S/D region. For example: $0.51 \leq x \leq 0.55$; $0.25 \leq y \leq 1.00$; $0.50 \leq z \leq 1.00$; Also, S/D spacer is undoped, while S/D region is heavily-doped with silicon (Si). |
| NMOS | $Si:In_yGa_{1-y}As_zP_{1-z}$ | $Si:In_yGa_{1-y}As_zP_{1-z}$ | $In_xGa_{1-x}As$ | Same or different composition for S/D spacer and S/D region. For example: $0.51 \leq x \leq 0.55$; $0.25 \leq y \leq 1.00$; $0.50 \leq z \leq 1.00$; Also, S/D spacer is lightly-doped with silicon (Si), while S/D region is heavily-doped with silicon (Si). |
| NMOS | GaSb | Mg:GaSb | InAs | Same composition for S/D spacer and S/D region. Broken bandgap contact to channel, where the valence band of p-type S/D region is above the conduction band of the channel. Also, S/D spacer is undoped, while S/D region is heavily-doped with magnesium (Mg). |

TABLE 2-continued

Example Group III-V Material Systems to Reduce BTBT

| NMOS | S/D Spacer | S/D Region | Channel | Notes |
|---|---|---|---|---|
| NMOS | Mg:GaSb | Mg:GaSb | InAs | Same composition for S/D spacer and S/D region. Broken bandgap contact to n-type channel, where the valence band of p-type S/D region is above the conduction band of the channel. Also, S/D spacer is lightly-doped with magnesium (Mg), while S/D region is heavily-doped with magnesium (Mg). |
| NMOS | $Ga_xAl_{1-x}Sb$ | $Mg:Ga_xAl_{1-x}Sb$ | InAs | Same or different composition for S/D spacer and S/D region. For example: $0.01 \leq x \leq 0.20$; Broken bandgap contact to n-type channel, where the valence band of p-type S/D region is above the conduction band of the channel. Also, S/D region is heavily-doped with magnesium (Mg) and S/D spacer is undoped. |
| NMOS | $Mg:Ga_xAl_{1-x}Sb$ | $Mg:Ga_xAl_{1-x}Sb$ | InAs | Same or different composition for S/D spacer and S/D region. For example: $0.01 \leq x \leq 0.20$; Broken bandgap contact to n-type channel, where the valence band of p-type S/D region is above the conduction band of the channel. Also, S/D region is heavily-doped with magnesium (Mg) and S/D spacer is lightly-doped with magnesium (Mg). |
| NMOS | $In_xGa_{1-x}Sb$ | $Mg:In_xGa_{1-x}Sb$ | InAs | Same or different composition for S/D spacer and S/D region. For example: $0.25 \leq x \leq 1.00$; Broken bandgap contact to n-type channel, where the valence band of p-type S/D region is above the conduction band of the channel. Also, S/D region is heavily-doped with magnesium (Mg) and S/D spacer is undoped. |
| NMOS | $Mg:In_xGa_{1-x}Sb$ | $Mg:In_xGa_{1-x}Sb$ | InAs | Same or different composition for S/D spacer and S/D region. For example: $0.25 \leq x \leq 1.00$; Broken bandgap contact to n-type channel, where the valence band of p-type S/D region is above the conduction band of the channel. Also, S/D region is heavily-doped with magnesium (Mg) and S/D spacer is lightly-doped with magnesium (Mg). |
| NMOS | $In_xGa_{1-x}P_ySb_{1-y}$ | $Si:In_xGa_{1-x}P_ySb_{1-y}$ | GaSb | Same or different composition for S/D spacer and S/D region. For example: $0.25 \leq x \leq 1.00$; $0.00 \leq y \leq 0.10$; Also, S/D region is heavily-doped with silicon (Si) and S/D spacer is undoped. |
| NMOS | $Si:In_xGa_{1-x}P_ySb_{1-y}$ | $Si:In_xGa_{1-x}P_ySb_{1-y}$ | GaSb | Same or different composition for S/D spacer and S/D region. For example: $0.25 \leq x \leq 1.00$; $0.00 \leq y \leq 0.10$; Also, S/D region is heavily-doped with silicon (Si) and S/D spacer is lightly-doped with silicon (Si). |

Note that the broken bandgap contact referred to for some examples of Table 2 means that the valence band of the spacer material being above the conduction band of the channel material. Since the valence band of the source/drain regions is above the conduction band of the channel, carriers can travel between the two materials with minimal (almost unmeasurable) or otherwise reduced resistance. This type of interface is sometimes referred to as a broken-gap heterostructure. So, while the other entries of Table 2 have n-type doped source/drain regions making contact to an n-type channel (meaning the channel is undoped or lightly-p-doped), these particular examples have p-type doped source/drain regions making contact to an n-type channel. Further note that in these particular cases, the transistors are still NMOS transistors, even though the source/drain regions are p-type doped, which is a property unique to broken bandgap materials.

Figure 4A:
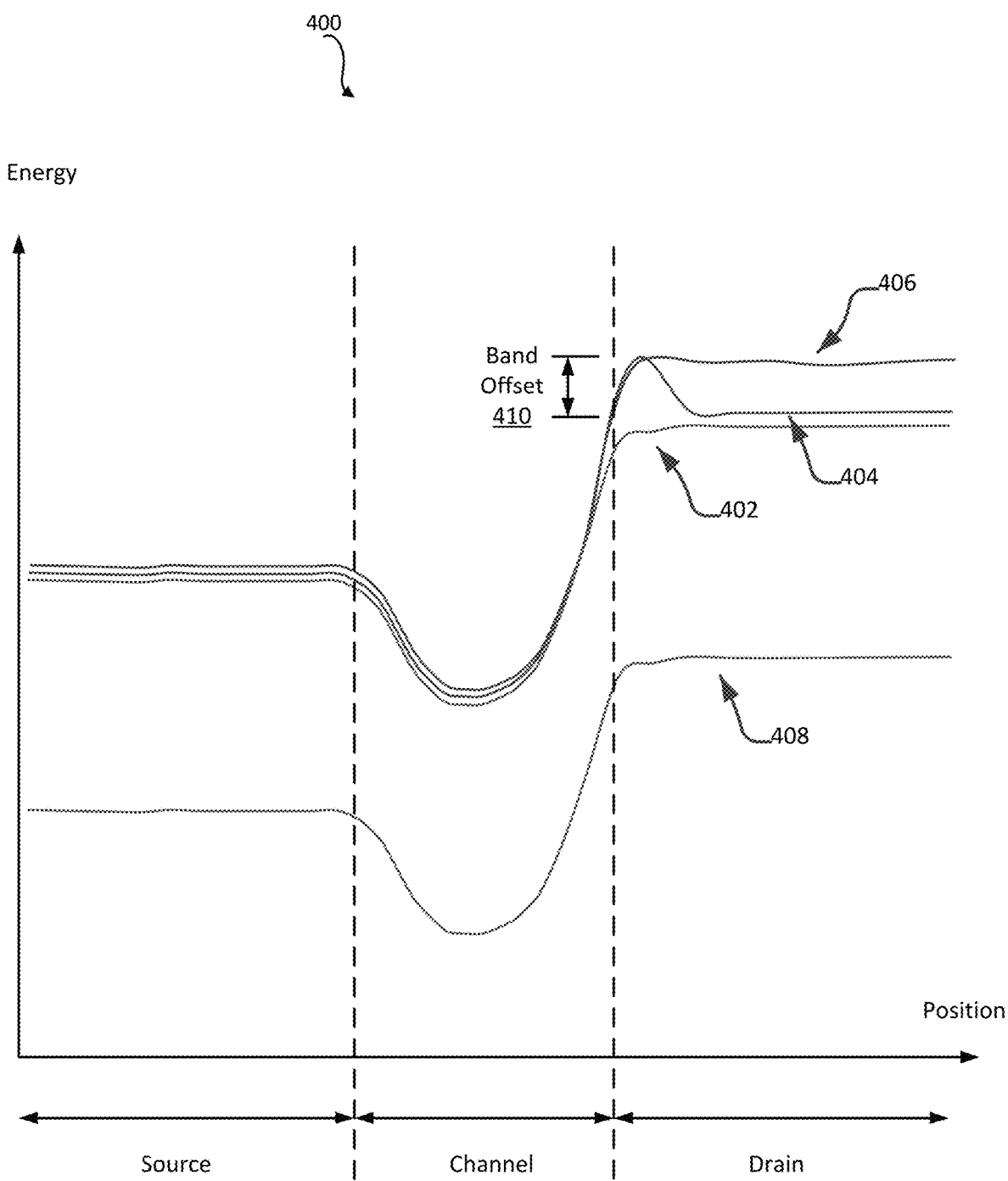
FIGS. 4a-4b each illustrates plots of conduction band energy and valence band energy, in accordance with example embodiments of the present disclosure.

FIG. 4a shows a collection of plots 400 that illustrate conduction band energy and valence band energy for various PMOS transistor devices, some configured in accordance with an embodiment of the present disclosure. Each of the three top plots 402, 404, 406 show conduction band energy as a function of position through the source region, channel region, and drain region (from left to right). The bottom plot 408 shows valence band energy as a function of position through the source region, channel region, and drain region (from left to right).

In more detail, plot 402 shows the conduction band energy for a standard integrated circuit transistor structure, that is to say a structure that does not employ source/drain spacers that facilitate a band structure as variously provided herein (e.g., in PMOS devices the source/drain spacers comprise a semiconductor material that provides a relatively high CBO and a relatively low VBO). Plot 404 shows the conduction band energy for the integrated circuit transistor structure illustrated in FIGS. 1a-b, as described above, which employs a lightly-doped SiGe:C spacer 112 between a germanium channel and heavily p-doped germanium source and drain regions 106, 108. Plot 406 shows the conduction band energy for the integrated circuit transistor structure illustrated in FIGS. 2a-b, as described above, which employs a lightly-doped SiGe:C spacer 210 between a germanium channel and heavily-doped SiGe:C source and drain regions 206, 208. The dopant is boron, but any number of dopants can be used, depending on desired polarity and desired conductivity.

As can be seen in a comparison of plots 404 and 406 relative to plot 402, the use of the SiGe:C semiconductor material provides an increased band offset, which corresponds to an increased conduction band offset (CBO) for the p-type carriers, which in turn eliminates or otherwise reduces undesirable tunneling (such as band-to-band tunneling from drain to channel, as well as source to the drain tunneling). Plot 408 shows the valence band energy which remains substantially the same for all three cases (e.g., standard device structure, SiGe:C spacer with germanium source/drain case, and SiGe:C for both spacer and source/drain case) at a relatively low level. This indicates that the extrinsic resistance of the transistor device does not materially increase with the use of SiGe:C spacers as provided in this example case.

Figure 4B:
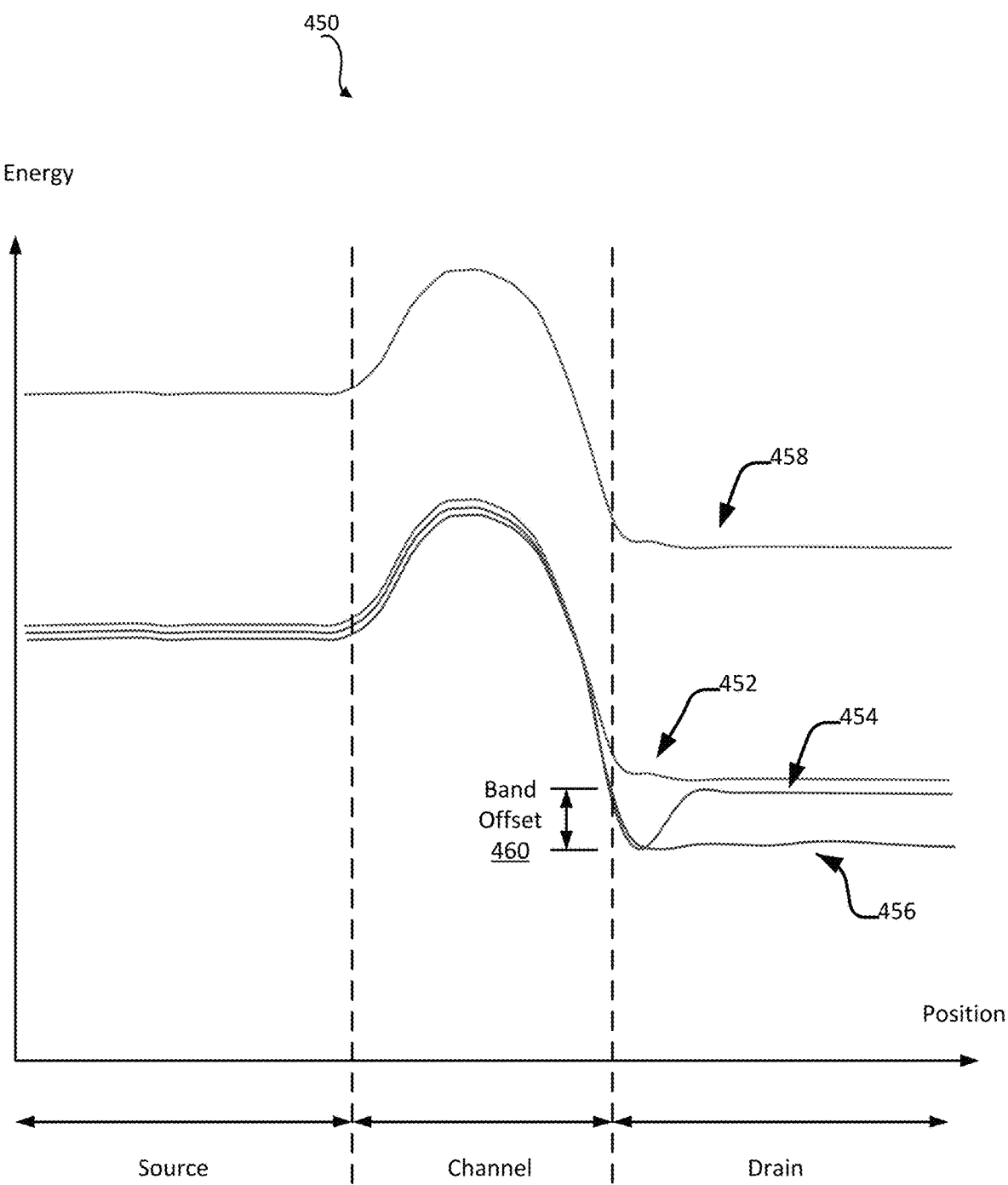

FIG. 4b shows a collection of plots 450 that illustrate conduction band energy and valence band energy for NMOS transistor devices, in accordance with certain embodiments of the present disclosure. Each of the three top plots 452, 454, 456 show valence band energy as a function of position through the source region, channel region, and drain region (from left to right). The bottom plot 458 shows conduction band energy as a function of position through the source region, channel region, and drain region (from left to right).

In more detail, plot 452 shows the valence band energy for a standard integrated circuit transistor structure, that is to say a structure that does not employ source/drain spacers that facilitate a band structure as variously provided herein (e.g., in NMOS devices the source/drain spacers comprise a semiconductor material that provides a relatively high VBO and a relatively low CBO). Plot 454 shows the valence band energy for the integrated circuit transistor structure illustrated in FIG. 3a, as described above, which employs a lightly-doped SiGe spacer 312 between a germanium channel and heavily n-doped germanium source and drain regions 306, 308. Plot 456 shows the conduction band energy for the integrated circuit transistor structure illustrated in FIG. 3b, as described above, which employs a lightly-doped SiGe spacer 312 between a germanium channel and heavily-doped SiGe source and drain regions 306, 308. The dopant is phosphorus, in this example case.

As can be seen in a comparison of plots 454 and 456 relative to plot 452, the use of the SiGe semiconductor material provides an increased band offset, which corresponds to an increased valence band offset (VBO) for the n-type carriers, which in turn eliminates or otherwise reduces undesirable tunneling (such as band-to-band tunneling from drain to channel, as well as source to the drain tunneling). Plot 458 shows the conduction band energy which remains substantially the same for all three cases (e.g., standard device structure, SiGe spacer with germanium source/drain case, and SiGe for both spacer and source/drain case) at a relatively low level. This indicates that the extrinsic resistance of the transistor device does not materially increase with the use of SiGe spacers as provided in this example case.

Methodology

Figure 5:
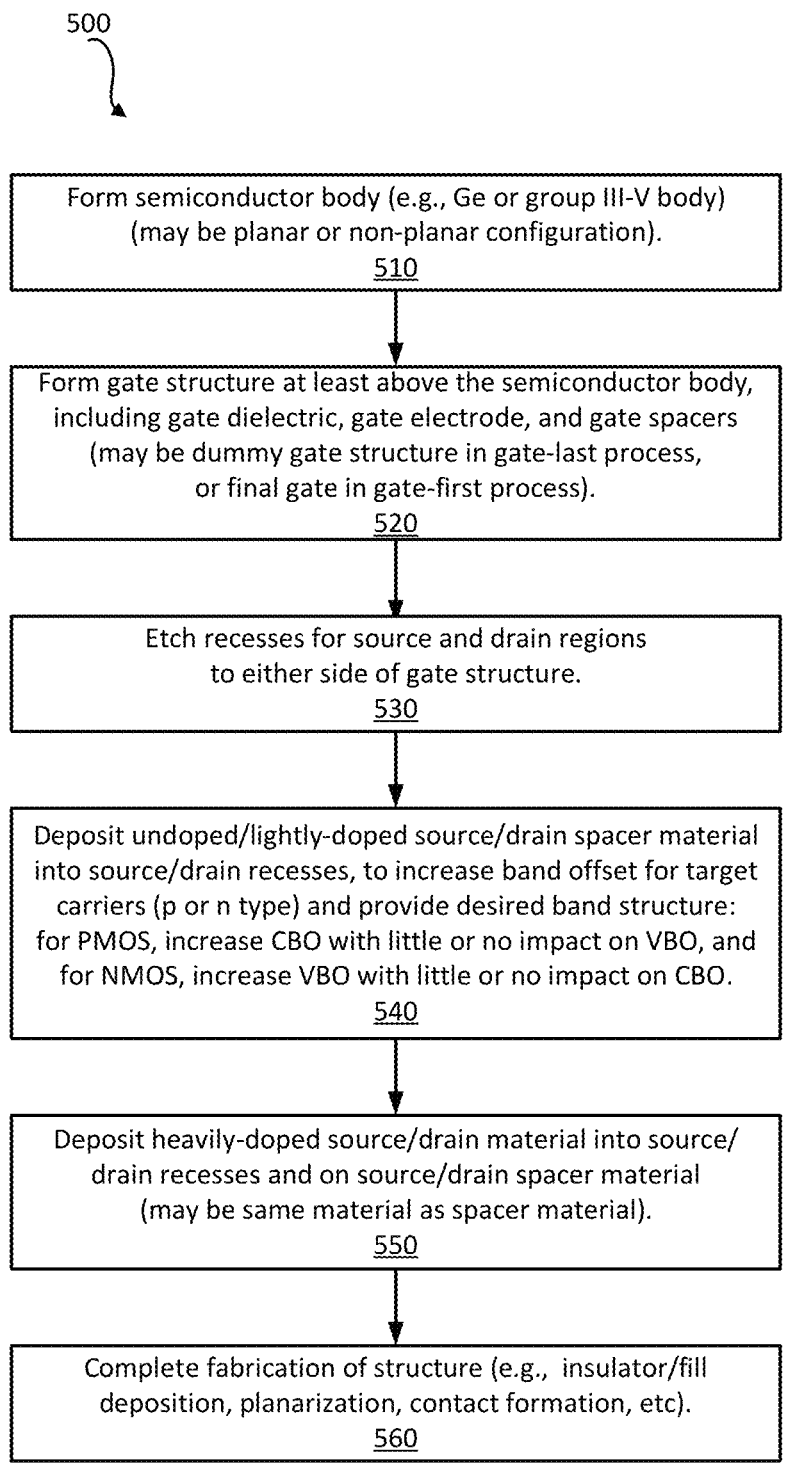
FIG. 5 illustrates a method for forming an integrated circuit transistor structure to reduce band-to-band tunneling, in accordance with certain embodiments of the present disclosure.

FIG. 5 illustrates a method for fabricating or forming an integrated circuit transistor structure to reduce band-to-band tunneling, in accordance with certain embodiments of the present disclosure. As can be seen, the example method includes a number of phases and sub-processes, the sequence of which may vary from one embodiment to another. However, when considered in the aggregate, these phases and sub-processes form a process for creation of an integrated circuit transistor structure with reduced band-to-band tunneling in accordance with certain of the embodiments disclosed herein. Note that the methodology may be used with a gate-first process or a gate-last process. Numerous variations and alternative configurations will be apparent in light of this disclosure.

As illustrated in FIG. 5, in an embodiment, method 500 for forming an integrated circuit transistor structure commences, at operation 510, by forming a semiconductor body, for example from germanium or III-V material. The semiconductor body may be planar (for planar transistor architecture), such as a bulk substrate or blanket layer. Alternatively, the semiconductor body may be non-planar, such as a fin. In any such cases, a channel region can be manifested within the semiconductor body, as will be appreciated. Next, at operation 520, a gate structure is formed and disposed at least above the semiconductor body. As previously explained, the gate structure is disposed above the semiconductor body (in planar devices), but may further be disposed on opposing sidewalls of the semiconductor body (in FinFET devices) or completely surrounding the semiconductor body (in gate-all-around devices). In any such cases, the gate structure generally includes a gate dielectric, gate electrode, and opposing gate spacers as previously explained.

As previously noted, one example embodiment refers to a gate-first process at 520, where the final gate materials are provided prior to the source/drain structures being formed. However, in other example embodiments, dummy gate materials may be provided at 520, such as silicon dioxide for the dummy gate dielectric and polysilicon for the dummy gate electrode. In such cases, the dummy gate materials are effectively a place holder for the final gate material and can be removed later in the process, such as after the source/drain regions are formed at 550 and dielectric fill material has been provided and planarized down to the dummy gate stack. Once the dummy gate stack is isolated (by applying a protective mask over the source/drain structures and dielectric fill material), the exposed dummy gate materials can be removed with an appropriate etch scheme, and replaced with the final gate structure materials, which could be the same materials as provided in a gate-first process (e.g., a high-k gate dielectric such as hafnium oxide and a gate electrode such as a tungsten plug with one or more titanium and/or titanium nitride layers for work function tuning). The methodology may then continue at 560, as will be discussed in turn.

At operation 530, a source recess and a drain recess are formed to either side of the gate structure, so as to allow for formation respectively therein of source and drain structures (including undoped/lightly-doped source/drain spacers and heavily-doped source/drain regions). As previously explained, the source and drain recesses will each undercut at least one of the gate electrode and/or gate dielectric according to some embodiments, and may be provisioned using any number of suitable etching schemes, including wet and/or dry isotropic and/or anisotropic etches.

At operation 540, an undoped/lightly-doped source/drain spacer material is epitaxially deposited into each of the source/drain recesses formed at 530. As previously explained, the source/drain spacer is configured to increase band offset for target carriers (p or n type) and provide desired band structure: for PMOS, increase CBO with little or no impact on VBO, and for NMOS, increase VBO with little or no impact on CBO. As such, the channel region of the semiconductor body will be separated from the forthcoming heavily-doped source and drain regions by the respective source/drain spacers.

At operation 550, heavily-doped source/drain material is epitaxially deposited into the source/drain recesses and at least partially on the source/drain spacer material provided at 540. Note that, in some embodiments, the heavily-doped source/drain material may be the same material as the undoped/lightly-doped spacer material, while in other embodiments the heavily-doped source/drain material is a compositionally different from the undoped/lightly-doped spacer material. As previously explained, compositionally different is intended to mean that the heavily-doped source/drain material is different from the undoped/lightly-doped spacer above and beyond any difference in polarity-based doping provisioned for purposes of configuring a p-type device or an n-type device.

In some embodiments, the semiconductor material selected for the source/drain spacers is undoped or lightly-doped silicon-germanium-carbon, for PMOS devices having a germanium channel, or undoped or lightly-doped silicon-germanium, for NMOS devices having a germanium channel. In other embodiments, the semiconductor material selected for the source/drain spacers is undoped or lightly-doped indium aluminum arsenide, for NMOS devices having an indium gallium arsenide channel. Tables 1 and 2 describe a number of other example embodiments for group IV and group III-V source/drain spacer materials In any such embodiments, the heavily-doped source/drain regions may be the same composition (but be heavily-doped with the desired impurity), or alternatively may be compositionally different as explained herein.

Note that one or more of the components of the source/drain structures provided herein may be graded. In such cases, the S/D structure may include one or more graded buffers or graded sections. In some such cases, there may be a bulk portion between the graded portions, the bulk portion having a relatively fixed composition. Any number of grading schemes can be used.

At 560, the structure can be completed using standard or proprietary fabrication techniques, which may include, for example, provisioning of fill materials, planarization, contact structure formation, etc. One or more interconnect layers may be formed on a device layer including the transistors formed as provided herein. Numerous integrated circuit structures can be fabricated to include such transistors.

For example, one or more such integrated circuit transistors may be formed in the fabrication of, for example, a processor or a communication chip or a memory chip or any other integrated circuit having transistors including MOS transistors. Such integrated circuits can then be used in various electronic devices and systems, such as desktop and laptop computers, smartphones, tablet computers, and test equipment, to name a few examples. Numerous applications and functional circuits will be apparent.

Example System

Figure 6:
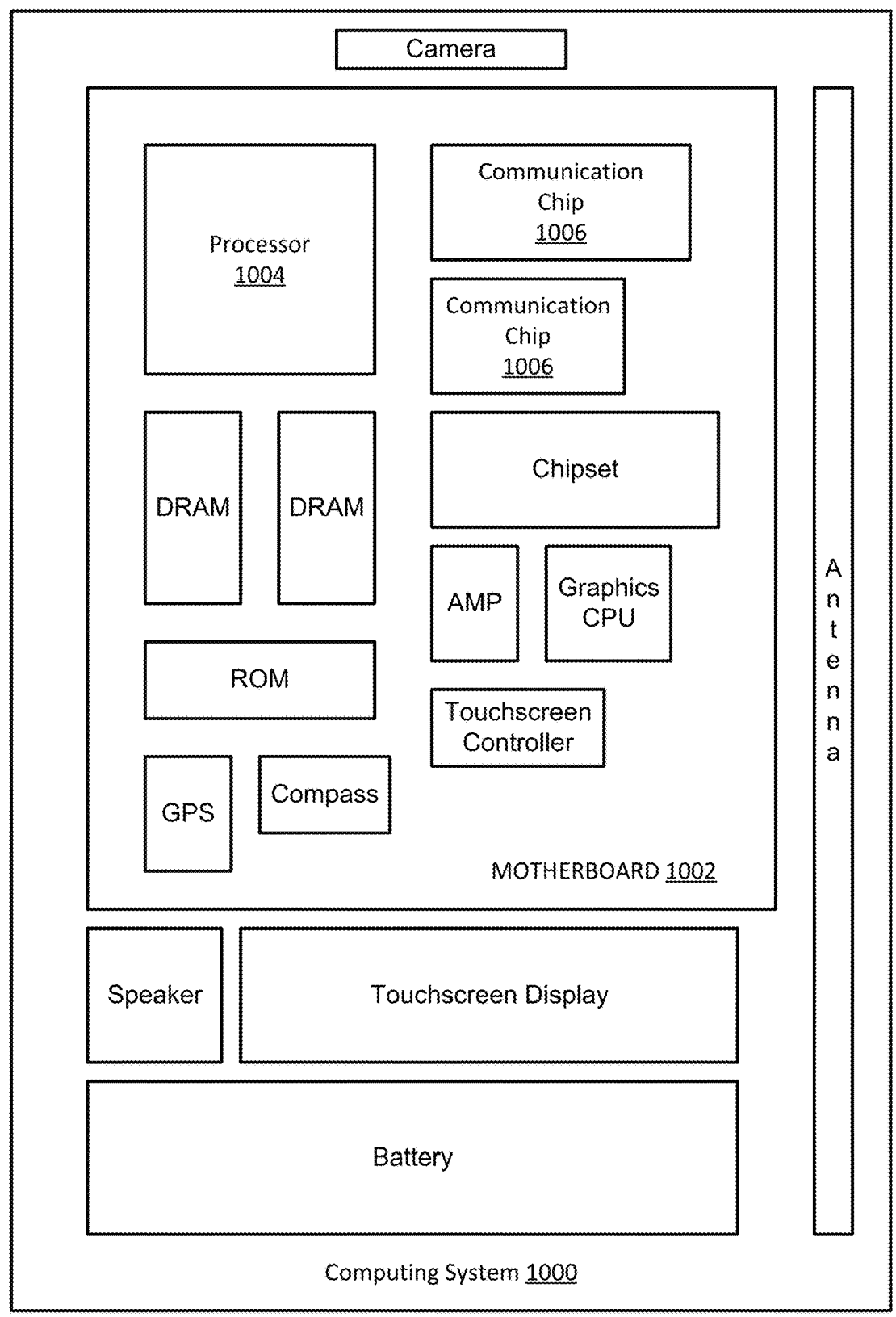
FIG. 6 illustrates a computing system implemented with integrated circuit structures and/or transistor devices formed using the techniques disclosed herein, in accordance with some embodiments of the present disclosure.

FIG. 6 illustrates a computing system 1000 implemented with integrated circuit structures and/or transistor devices formed using the techniques disclosed herein, in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

Further Example Embodiments

The following examples pertain to further embodiments, from which numerous permutations and configurations will be apparent.

Example 1 is an integrated circuit transistor structure, comprising: a body including a first semiconductor material, the first semiconductor material having a first band gap; a gate structure at least above the body, the gate structure including a gate dielectric and a gate electrode, the gate dielectric between the body and the gate electrode; a source region and a drain region, the body between the source region and the drain region; and a spacer between the body and one of the source region or the drain region, the spacer extending under one or both of the gate electrode and the gate dielectric, the spacer including a second semiconductor material, the second semiconductor material having a second bandgap that is greater than the first bandgap; wherein the second semiconductor material provides a conduction band offset (CBO) of 0.1 eV or higher relative to the first semiconductor material, and a valence band offset (VBO) in the range of −0.05 eV to 0.05 eV relative to the first semiconductor material.

Example 2 includes the subject matter of Example 1, wherein the spacer between the body and one of the source region or the drain region is a first spacer, the integrated circuit transistor structure further includes a second spacer between the body and the other one of the source region or the drain region, the second spacer extending under one or both of the gate electrode and the gate dielectric, the second spacer including the second semiconductor material.

Example 3 includes the subject matter of Example 1 or 2, wherein the spacer is undoped and said one of the source region or the drain region includes a p-type impurity at a concentration in excess of 1E18 $cm^3$.

Example 4 includes the subject matter of Example 1 or 2, wherein the spacer includes a p-type impurity at a concentration of less than 1E18 $cm^3$ and said one of the source region or the drain region includes a p-type impurity at a concentration in excess of 1E18 $cm^3$.

Example 5 includes the subject matter of Example 1 or 2, wherein the spacer includes a p-type impurity at a concentration of less than 1E16 $cm^3$ and said one of the source region or the drain region includes a p-type impurity at a concentration in excess of 1E18 $cm^3$.

Example 6 includes the subject matter of any of the previous Examples, wherein said one of the source region or the drain region comprises a germanium concentration in excess of 75 atomic percent.

Example 7 includes the subject matter of any of the preceding Examples, wherein said one of the source region or the drain region comprises a germanium concentration in excess of 99 atomic percent.

Example 8 includes the subject matter of any of the previous Examples, wherein said one of the source region or the drain region comprises silicon, germanium, and carbon.

Example 9 includes the subject matter of any of the previous Examples, wherein said one of the source region or the drain region and the spacer are compositionally the same, except that said one of the source region or the drain region includes a p-type impurity at a concentration in excess of 1E18 $cm^3$, and the p-type impurity is either not included in the spacer or is included in the spacer at a concentration below 1E17 $cm^3$.

Example 10 includes the subject matter of any of the previous Examples, wherein the CBO threshold is at least 180 milli-electronvolts (meV), and the VBO threshold is less than 10 meV.

Example 11 includes the subject matter of any of the previous Examples, wherein the first semiconductor material is germanium such that the body is a body of germanium.

Example 12 includes the subject matter of any of the previous Examples, wherein the body, gate structure, spacer, and source and drain regions are part of a p-type metal oxide semiconductor (PMOS) transistor.

Example 13 includes the subject matter of any of the previous Examples, wherein the body is undoped or lightly n-doped.

Example 14 includes the subject matter of any of the previous Examples, wherein the spacer comprises silicon, germanium, and carbon.

Example 15 includes the subject matter of Example 14, wherein the spacer includes about 10% to 16% silicon by atomic percentage, 80% to 90% germanium by atomic percentage, and 1% to 4% carbon by atomic percentage.

Example 16 is an integrated circuit transistor structure, comprising: a body including a first semiconductor material, the first semiconductor material having a first band gap; a gate structure at least above the body, the gate structure including a gate dielectric and a gate electrode, the gate dielectric between the body and the gate electrode; a source region and a drain region, the body between the source region and the drain region; and a spacer between the body and one of the source region or the drain region, the spacer extending under one or both of the gate electrode and the gate dielectric, the spacer including a second semiconductor material, the second semiconductor material having a second bandgap that is greater than the first bandgap; wherein the second semiconductor material provides a valence band offset (VBO) of 0.1 eV or higher relative to the first semiconductor material, and a conduction band offset (CBO) in the range of −0.05 eV to 0.05 eV relative to the first semiconductor material.

Example 17 includes the subject matter of Example 16, wherein the spacer between the body and one of the source region or the drain region is a first spacer, the integrated circuit transistor structure further includes a second spacer between the body and the other one of the source region or the drain region, the second spacer extending under one or both of the gate electrode and the gate dielectric, the second spacer including the second semiconductor material.

Example 18 includes the subject matter of Example 16 or 17, wherein the spacer is undoped and said one of the source region or the drain region includes a n-type impurity at a concentration in excess of 1E18 cm$^3$.

Example 19 includes the subject matter of Example 16 or 17, wherein the spacer includes a n-type impurity at a concentration of less than 1E18 cm$^3$ and said one of the source region or the drain region includes a n-type impurity at a concentration in excess of 1E18 cm$^3$.

Example 20 includes the subject matter of Example 16 or 17, wherein the spacer includes a n-type impurity at a concentration of less than 1E16 cm$^3$ and said one of the source region or the drain region includes a n-type impurity at a concentration in excess of 1E18 cm$^3$.

Example 21 includes the subject matter of Example 16 or 17, wherein said one of the source region or the drain region is a group III-V semiconductor material or compound, and the first semiconductor material is distinct from the source region and the drain region and is also a group III-V semiconductor material or compound. In one such example case, said one of the source region or the drain region comprises at least two of indium (In), gallium (Ga), arsenic (As), and antimony (Sb), and the first semiconductor material is distinct from the source region and the drain region and comprises at least two of In, Ga, As, and Sb.

Example 22 includes the subject matter of Example 21, wherein said one of the source region or the drain region comprises an indium concentration in excess of 50 atomic percent, and/or wherein first semiconductor material comprises an indium concentration in excess of 50 atomic percent.

Example 23 includes the subject matter of Example 21 or 22, wherein said one of the source region or the drain region further comprises phosphorus.

Example 24 includes the subject matter of Example 21 or 22, wherein the first semiconductor material comprises $In_xGa_{1-x}As$, and said one of the source region or the drain region comprises $In_yAl_{1-y}As$, wherein $0.51 \leq x \leq 0.55$, and $y \geq 0.6$.

Example 25 includes the subject matter of Example 21 or 22, wherein the first semiconductor material comprises $In_xGa_{1-x}As$, and said one of the source region or the drain region comprises $InAs_yP_{1-y}$, wherein $0.51 \leq x \leq 0.55$, and $y \geq 0.1$.

Example 26 includes the subject matter of Example 21 or 22, wherein the first semiconductor material comprises $In_xGa_{1-x}As$, and said one of the source region or the drain region comprises $In_yGa_{1-y}As_zP_{1-z}$, wherein $0.51 \leq x \leq 0.55$, $0.25 \leq y \leq 1.00$, and $0.50 \leq z \leq 1.00$.

Example 27 includes the subject matter of Example 21 or 22, wherein the first semiconductor material comprises InAs, and said one of the source region or the drain region comprises GaSb.

Example 28 includes the subject matter of Example 27, wherein the spacer and the body provide a broken-gap heterostructure, wherein said one of the source region or the drain region includes a p-type impurity at a concentration in excess of 1E18 cm$^3$.

Example 29 includes the subject matter of Example 21 or 22, wherein the first semiconductor material comprises InAs, and said one of the source region or the drain region comprises $Ga_xAl_{1-x}Sb$, wherein $0.01 \leq x \leq 0.20$.

Example 30 includes the subject matter of Example 29, wherein the spacer and the body provide a broken-gap heterostructure, wherein said one of the source region or the drain region includes a p-type impurity at a concentration in excess of 1E18 cm$^3$.

Example 31 includes the subject matter of Example 21 or 22, wherein the first semiconductor material comprises InAs, and said one of the source region or the drain region comprises $In_xGa_{1-x}Sb$, wherein $0.25 \leq x \leq 1.00$.

Example 32 includes the subject matter of Example 31, wherein the spacer and the body provide a broken-gap heterostructure, wherein said one of the source region or the drain region includes a p-type impurity at a concentration in excess of 1E18 cm$^3$.

Example 33 includes the subject matter of Example 21 or 22, wherein the first semiconductor material comprises GaSb, and said one of the source region or the drain region comprises $In_xGa_{1-x}P_ySb_{1-y}$, wherein $0.25 \leq x \leq 1.00$, and $0.00 \leq y \leq 0.10$.

Example 34 includes the subject matter of Example 33, wherein the spacer and the body provide a broken-gap heterostructure, wherein said one of the source region or the drain region includes a p-type impurity at a concentration in excess of 1E18 cm$^3$.

Example 35 includes the subject matter of any of Examples 16 through 34, wherein the CBO threshold is at least 180 milli-electronvolts (meV), and the VBO threshold is less than 10 meV.

Example 36 includes the subject matter of any of Examples 16 through 35, wherein the body, gate structure, spacer, and source and drain regions are part of a n-type metal oxide semiconductor (NMOS) transistor.

Example 37 includes the subject matter of any of Examples 16 through 36, wherein the body is undoped or lightly p-doped.

Example 38 includes the subject matter of any of Examples 16 through 37, wherein the spacer comprises group III-V semiconductor material or compound. In some such example cases, the spacer comprises at least two of indium (In), gallium (Ga), arsenic (As), and antimony (Sb).

Example 39 includes the subject matter of Example 38, wherein said one of the source region or the drain region and the spacer are compositionally the same, except that said one of the source region or the drain region includes an impurity at a concentration in excess of $1E18$ $cm^3$, and the impurity is either not included in the spacer or is included in the spacer at a concentration below $1E17$ $cm^3$.

Example 40 includes the subject matter of Example 38, wherein said one of the source region or the drain region and the spacer are compositionally different, above and beyond any differences in impurity doping.

Example 41 includes the subject matter of any of Examples 16 through 20 and 35 through 37, wherein said one of the source region or the drain region is either silicon or silicon and germanium, and the first semiconductor material is germanium.

Example 42 includes the subject matter of Example 41, wherein said one of the source region or the drain region and the spacer are compositionally the same, except that said one of the source region or the drain region includes an impurity at a concentration in excess of $1E18$ $cm^3$, and the impurity is either not included in the spacer or is included in the spacer at a concentration below $1E17$ $cm^3$.

Example 43 is a method of forming an integrated circuit transistor structure, comprising: providing a body including a first semiconductor material, the first semiconductor material having a first band gap; providing a gate structure at least above the body, the gate structure including a gate dielectric and a gate electrode, the gate dielectric between the body and the gate electrode; providing a source region and a drain region, the body between the source region and the drain region; and providing a spacer between the body and one of the source region or the drain region, the spacer extending under one or both of the gate electrode and the gate dielectric, the spacer including a second semiconductor material, the second semiconductor material having a second bandgap that is greater than the first bandgap; wherein the second semiconductor material provides a conduction band offset (CBO) of 0.1 eV or higher relative to the first semiconductor material, and a valence band offset (VBO) in the range of −0.05 eV to 0.05 eV relative to the first semiconductor material.

Example 44 includes the subject matter of Example 43, wherein the spacer between the body and one of the source region or the drain region is a first spacer, and the method further includes providing a second spacer between the body and the other one of the source region or the drain region, the second spacer extending under one or both of the gate electrode and the gate dielectric, the second spacer including the second semiconductor material.

Example 45 includes the subject matter of Example 43 or 44, wherein the spacer is undoped and said one of the source region or the drain region includes a p-type impurity at a concentration in excess of $1E18$ $cm^3$.

Example 46 includes the subject matter of Example 43 or 44, wherein the spacer includes a p-type impurity at a concentration of less than $1E18$ $cm^3$ and said one of the source region or the drain region includes a p-type impurity at a concentration in excess of $1E18$ $cm^3$.

Example 47 includes the subject matter of Example 43 or 44, wherein the spacer includes a p-type impurity at a concentration of less than $1E16$ $cm^3$ and said one of the source region or the drain region includes a p-type impurity at a concentration in excess of $1E18$ $cm^3$.

Example 48 includes the subject matter of any of Examples 43 through 47, wherein said one of the source region or the drain region comprises a germanium concentration in excess of 75 atomic percent.

Example 49 includes the subject matter of any of Examples 43 through 48, wherein said one of the source region or the drain region comprises a germanium concentration in excess of 99 atomic percent.

Example 50 includes the subject matter of any of Examples 43 through 49, wherein said one of the source region or the drain region comprises silicon, germanium, and carbon.

Example 51 includes the subject matter of any of Examples 43 through 50, wherein said one of the source region or the drain region and the spacer are compositionally the same, except that said one of the source region or the drain region includes a p-type impurity at a concentration in excess of $1E18$ $cm^3$, and the p-type impurity is either not included in the spacer or is included in the spacer at a concentration below $1E17$ $cm^3$.

Example 52 includes the subject matter of any of Examples 43 through 51, wherein the CBO threshold is at least 180 milli-electronvolts (meV), and the VBO threshold is less than 10 meV.

Example 53 includes the subject matter of any of Examples 43 through 52, wherein the first semiconductor material is germanium such that the body is a body of germanium.

Example 54 includes the subject matter of any of Examples 43 through 53, wherein the body, gate structure, spacer, and source and drain regions are part of a p-type metal oxide semiconductor (PMOS) transistor.

Example 55 includes the subject matter of Example 54, wherein the body is undoped or lightly n-doped.

Example 56 includes the subject matter of any of Examples 43 through 55, wherein the spacer comprises silicon, germanium, and carbon.

Example 57 includes the subject matter of Example 56, wherein the spacer includes about 10% to 16% silicon by atomic percentage, 80% to 90% germanium by atomic percentage, and 1% to 4% carbon by atomic percentage.

Example 58 is a method of forming an integrated circuit transistor structure, comprising: a body including a first semiconductor material, the first semiconductor material having a first band gap; a gate structure at least above the body, the gate structure including a gate dielectric and a gate electrode, the gate dielectric between the body and the gate electrode; a source region and a drain region, the body between the source region and the drain region; and a spacer between the body and one of the source region or the drain region, the spacer extending under one or both of the gate electrode and the gate dielectric, the spacer including a second semiconductor material, the second semiconductor material having a second bandgap that is greater than the first bandgap; wherein the second semiconductor material provides a valence band offset (VBO) of 0.1 eV or higher relative to the first semiconductor material, and a conduction band offset (CBO) in the range of −0.05 eV to 0.05 eV relative to the first semiconductor material.

Example 59 includes the subject matter of Example 58, wherein the spacer between the body and one of the source region or the drain region is a first spacer, the method further includes a second spacer between the body and the other one of the source region or the drain region, the second spacer extending under one or both of the gate electrode and the gate dielectric, the second spacer including the second semiconductor material.

Example 60 includes the subject matter of Example 58 or 59, wherein the spacer is undoped and said one of the source region or the drain region includes a n-type impurity at a concentration in excess of 1E18 cm$^3$.

Example 61 includes the subject matter of Example 58 or 59, wherein the spacer includes a n-type impurity at a concentration of less than 1E18 cm$^3$ and said one of the source region or the drain region includes a n-type impurity at a concentration in excess of 1E18 cm$^3$.

Example 62 includes the subject matter of Example 58 or 59, wherein the spacer includes a n-type impurity at a concentration of less than 1E16 cm$^3$ and said one of the source region or the drain region includes a n-type impurity at a concentration in excess of 1E18 cm$^3$.

Example 63 includes the subject matter of any of Examples 58 through 62, wherein said one of the source region or the drain region is a group III-V semiconductor material or compound, and the first semiconductor material is distinct from the source region and the drain region and is also a group III-V semiconductor material or compound. In one such example case, said one of the source region or the drain region comprises at least two of indium (In), gallium (Ga), arsenic (As), and antimony (Sb), and the first semiconductor material is distinct from the source region and the drain region and comprises at least two of In, Ga, As, and Sb.

Example 64 includes the subject matter of Example 63, wherein said one of the source region or the drain region comprises an indium concentration in excess of 50 atomic percent, and/or wherein first semiconductor material comprises an indium concentration in excess of 50 atomic percent.

Example 65 includes the subject matter of Example 63 or 64, wherein said one of the source region or the drain region further comprises phosphorus.

Example 66 includes the subject matter of Example 63 or 64, wherein the first semiconductor material comprises In$_x$Ga$_{1-x}$As, and said one of the source region or the drain region comprises In$_y$Al$_{1-y}$As, wherein 0.51≤x≤0.55, and y≥0.6.

Example 67 includes the subject matter of Example 63 or 64, wherein the first semiconductor material comprises In$_x$Ga$_{1-x}$As, and said one of the source region or the drain region comprises InAs$_y$P$_{1-y}$, wherein 0.51≤x≤0.55, and y≥0.1.

Example 68 includes the subject matter of Example 63 or 64, wherein the first semiconductor material comprises In$_x$Ga$_{1-x}$As, and said one of the source region or the drain region comprises In$_y$Ga$_{1-y}$As$_z$P$_{1-z}$, wherein 0.51≤x≤0.55, 0.25≤y≤1.00, and 0.50≤z≤1.00.

Example 69 includes the subject matter of Example 63 or 64, wherein the first semiconductor material comprises InAs, and said one of the source region or the drain region comprises GaSb.

Example 70 includes the subject matter of Example 69, wherein the spacer and the body provide a broken-gap heterostructure, wherein said one of the source region or the drain region includes a p-type impurity at a concentration in excess of 1E18 cm$^3$.

Example 71 includes the subject matter of Example 63 or 64, wherein the first semiconductor material comprises InAs, and said one of the source region or the drain region comprises Ga$_x$Al$_{1-x}$Sb, wherein 0.01≤x≤0.20.

Example 72 includes the subject matter of Example 71, wherein the spacer and the body provide a broken-gap heterostructure, wherein said one of the source region or the drain region includes a p-type impurity at a concentration in excess of 1E18 cm$^3$.

Example 73 includes the subject matter of Example 63 or 64, wherein the first semiconductor material comprises InAs, and said one of the source region or the drain region comprises In$_x$Ga$_{1-x}$Sb, wherein 0.25≤x≤1.00.

Example 74 includes the subject matter of Example 73, wherein the spacer and the body provide a broken-gap heterostructure, wherein said one of the source region or the drain region includes a p-type impurity at a concentration in excess of 1E18 cm$^3$.

Example 75 includes the subject matter of Example 63 or 64, wherein the first semiconductor material comprises GaSb, and said one of the source region or the drain region comprises In$_x$Ga$_{1-x}$P$_y$Sb$_{1-y}$, wherein 0.25≤x≤1.00, and 0.00≤y≤0.10.

Example 76 includes the subject matter of Example 75, wherein the spacer and the body provide a broken-gap heterostructure, wherein said one of the source region or the drain region includes a p-type impurity at a concentration in excess of 1E18 cm$^3$.

Example 77 includes the subject matter of any of Examples 58 through 76, wherein the CBO threshold is at least 180 milli-electronvolts (meV), and the VBO threshold is less than 10 meV.

Example 78 includes the subject matter of any of Examples 58 through 77, wherein the body, gate structure, spacer, and source and drain regions are part of a n-type metal oxide semiconductor (NMOS) transistor.

Example 79 includes the subject matter of any of Examples 58 through 78, wherein the body is undoped or lightly p-doped.

Example 80 includes the subject matter of any of Examples 58 through 79, wherein the spacer comprises at least two of indium (In), gallium (Ga), arsenic (As), and antimony (Sb).

Example 81 includes the subject matter of Example 80, wherein said one of the source region or the drain region and the spacer are compositionally the same, except that said one of the source region or the drain region includes an impurity at a concentration in excess of 1E18 cm$^3$, and the impurity is either not included in the spacer or is included in the spacer at a concentration below 1E17 cm$^3$.

Example 82 includes the subject matter of Example 80, wherein said one of the source region or the drain region and the spacer are compositionally different, above and beyond any differences in impurity doping.

Example 83 includes the subject matter of any of Examples 58 through 62 and 77 through 79, wherein said one of the source region or the drain region is either silicon or silicon and germanium, and the first semiconductor material is germanium.

Example 84 includes the subject matter of Example 83, wherein said one of the source region or the drain region and the spacer are compositionally the same, except that said one of the source region or the drain region includes an impurity at a concentration in excess of 1E18 cm$^3$, and the impurity is either not included in the spacer or is included in the spacer at a concentration below 1E17 cm$^3$.

Example 85 is an integrated circuit transistor structure, comprising: a germanium body; a gate structure at least above the germanium body, the gate structure including a gate dielectric and a gate electrode, the gate dielectric between the germanium body and the gate electrode, and in direct contact with the germanium body; a source region and a drain region, the germanium body between the source region and the drain region; and a spacer between the germanium body and one of the source region or the drain region, the spacer extending under one or both of the gate electrode and the gate dielectric, the spacer comprising silicon, germanium and carbon.

Example 86 includes the subject matter of Example 85, wherein the spacer is undoped and said one of the source region or the drain region includes a p-type impurity at a concentration in excess of 1E18 cm$^3$.

Example 87 includes the subject matter of Example 85 or 86, wherein said one of the source region or the drain region comprises a germanium concentration in excess of 75 atomic percent.

Example 88 includes the subject matter of any of Examples 85 through 87, wherein said one of the source region or the drain region comprises a germanium concentration in excess of 98 atomic percent.

Example 89 includes the subject matter of any of Examples 85 through 88, wherein said one of the source region or the drain region comprises a germanium concentration in excess of 99 atomic percent.

Example 90 includes the subject matter of any of Examples 85 through 89, wherein said one of the source region or the drain region comprises silicon, germanium, and carbon.

Example 91 includes the subject matter of any of Examples 85 through 90, wherein said one of the source region or the drain region and the spacer are compositionally the same, except that said one of the source region or the drain region includes a p-type impurity at a concentration in excess of 1E18 cm$^3$, and the p-type impurity is either not included in the spacer or is included in the spacer at a concentration below 1E17 cm$^3$.

Example 92 includes the subject matter of any of Examples 85 through 91, wherein the spacer and said one of the source region or the drain region comprise substantially equal concentrations of silicon, germanium, and carbon. For instance, in some such embodiments, concentrations within 10 percent of a target concentration are considered substantially equal, while in other embodiments concentrations within 5 percent of a target concentration are considered substantially equal, while in other embodiments concentrations within 2.5 percent of a target concentration are considered substantially equal, while in other embodiments concentrations within 1 percent of a target concentration are considered substantially equal. In still other embodiments, concentrations within 5 atomic percent of one another are considered substantially equal, or within 2.5 atomic percent of one another are considered substantially equal, or within 1 atomic percent of one another are considered substantially equal. As will be appreciated, the larger the target concentration, the greater the atomic percent variance from that target concentration may be while still remaining a status of substantially equal. For instance, if the target atomic percentage for a given component is relatively small, such as 4 atomic percent, then an atomic percentage in the range of about 2 to 3 atomic percent, or 5 to 6 atomic percent (variance of about 1 to 2 atomic percent from target concentration), while in another example case, if the target atomic percentage for a given component is relatively large, such as 50 atomic percent, then an atomic percentage in the range of about 45 to 49 atomic percent, or 51 to 55 atomic percent (variance of about 1 to 5 atomic percent from target concentration). In a more general sense, concentrations can vary while still maintaining a desired range of equality (within a given range acceptable for a given application) that may vary from one embodiment to the next, as will be appreciated in light of this disclosure.

Example 93 includes the subject matter of any of Examples 85 through 92, wherein said one of the source region or the drain region and the spacer each includes about 10% to 16% silicon by atomic percentage, 80% to 90% germanium by atomic percentage, and 1% to 4% carbon by atomic percentage.

Example 94 includes the subject matter of any of Examples 85 through 93, wherein the integrated circuit transistor structure is a PMOS transistor structure.

Example 95 is an integrated circuit transistor structure, comprising: a germanium body; a gate structure at least above the germanium body, the gate structure including a gate dielectric and a gate electrode, the gate dielectric between the germanium body and the gate electrode, and in direct contact with the germanium body; a source region and a drain region, the germanium body between the source region and the drain region, the source and drain regions comprising at least one of silicon and germanium and having a silicon centration of 80 atomic percent or more; and a spacer between the germanium body and one of the source region or the drain region, the spacer extending under one or both of the gate electrode and the gate dielectric, the spacer being silicon or silicon germanium having a silicon concentration of 80 atomic percent or more.

Example 96 includes the subject matter of Example 95, wherein the spacer is undoped and said one of the source region or the drain region is doped with an n-type impurity at a concentration in excess of 1E18 cm$^3$.

Example 97 includes the subject matter of Example 95 or 96, wherein said one of the source region or the drain region comprises a silicon concentration in excess of 95 atomic percent.

Example 98 includes the subject matter of any of Examples 95 through 97, wherein said one of the source region or the drain region comprises a silicon concentration in excess of 98 atomic percent.

Example 99 includes the subject matter of any of Examples 95 through 98, wherein said one of the source region or the drain region comprises a silicon concentration in excess of 99 atomic percent.

Example 100 includes the subject matter of any of Examples 95 through 99, wherein said one of the source region or the drain region comprises silicon and germanium.

Example 101 includes the subject matter of any of Examples 95 through 100, wherein said one of the source region or the drain region and the spacer are compositionally the same, except that said one of the source region or the drain region is doped with an n-type impurity at a concentration in excess of 1E18 cm$^3$, and the spacer is either undoped or doped with the n-type impurity at a concentration below 1E17 cm$^3$.

Example 102 includes the subject matter of any of Examples 95 through 101, wherein the spacer and said one of the source region or the drain region comprise substantially equal concentrations of at least one of silicon and germanium.

Example 103 includes the subject matter of any of Examples 95 through 102, wherein said one of the source region or the drain region and the spacer each includes about 10% to 20% germanium by atomic percentage, 80% to 90% germanium by atomic percentage.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications. It is intended that the scope of the present disclosure be limited not be this detailed description, but rather by the claims appended hereto. Future filed applications claiming priority to this application may claim the disclosed subject matter in a different manner, and may generally include any set of one or more elements as variously disclosed or otherwise demonstrated herein.

What is claimed is:

1. An integrated circuit transistor structure, comprising:
a body including a first semiconductor material, the first semiconductor material having a first band gap;
a gate structure at least above the body, the gate structure including a gate dielectric and a gate electrode, the gate dielectric between the body and the gate electrode;
a source region and a drain region, the body between the source region and the drain region; and
a spacer between the body and one of the source region or the drain region, the spacer extending under one or both of the gate electrode and the gate dielectric, the spacer including a second semiconductor material, the second semiconductor material having a second bandgap that is greater than the first bandgap;
wherein the second semiconductor material provides a conduction band offset (CBO) of 0.1 eV or higher relative to the first semiconductor material, and a valence band offset (VBO) in the range of −0.05 eV to 0.05 eV relative to the first semiconductor material.

2. The integrated circuit transistor structure of claim 1, wherein the spacer is undoped and said one of the source region or the drain region includes a p-type impurity at a concentration in excess of 1E18 cm$^3$.

3. The integrated circuit transistor structure of claim 1, wherein said one of the source region or the drain region comprises a germanium concentration in excess of 75 atomic percent.

4. The integrated circuit transistor structure of claim 1, wherein said one of the source region or the drain region comprises silicon, germanium, and carbon.

5. The integrated circuit transistor structure of claim 1, wherein said one of the source region or the drain region and the spacer are compositionally the same, except that said one of the source region or the drain region includes a p-type impurity at a concentration in excess of 1E18 cm$^3$, and the p-type impurity is either not included in the spacer or is included in the spacer at a concentration below 1E17 cm$^3$.

6. The integrated circuit transistor structure of claim 1, wherein the first semiconductor material is germanium such that the body is a body of germanium.

7. The integrated circuit transistor structure of claim 1, wherein the spacer comprises silicon, germanium, and carbon.

8. The integrated circuit transistor structure of claim 7, wherein the spacer includes about 10% to 16% silicon by atomic percentage, 80% to 90% germanium by atomic percentage, and 1% to 4% carbon by atomic percentage.

9. An integrated circuit transistor structure, comprising:
a body including a first semiconductor material, the first semiconductor material having a first band gap;
a gate structure at least above the body, the gate structure including a gate dielectric and a gate electrode, the gate dielectric between the body and the gate electrode;
a source region and a drain region, the body between the source region and the drain region; and
a spacer between the body and one of the source region or the drain region, the spacer extending under one or both of the gate electrode and the gate dielectric, the spacer including a second semiconductor material, the second semiconductor material having a second bandgap that is greater than the first bandgap;
wherein the second semiconductor material provides a valence band offset (VBO) of 0.1 eV or higher relative to the first semiconductor material, and a conduction band offset (CBO) in the range of −0.05 eV to 0.05 eV relative to the first semiconductor material.

10. The integrated circuit transistor structure of claim 9, wherein the spacer is undoped and said one of the source region or the drain region includes a n-type impurity at a concentration in excess of 1E18 cm$^3$.

11. The integrated circuit transistor structure of claim 9, wherein said one of the source region or the drain region comprises at least two of indium (In), gallium (Ga), arsenic (As), and antimony (Sb), and the first semiconductor material is distinct from the source region and the drain region and comprises at least two of In, Ga, As, and Sb.

12. The integrated circuit transistor structure of claim 11, wherein said one of the source region or the drain region comprises an indium concentration in excess of 50 atomic percent, and wherein first semiconductor material comprises an indium concentration in excess of 50 atomic percent.

13. The integrated circuit transistor structure of claim 11, wherein said one of the source region or the drain region further comprises phosphorus.

14. The integrated circuit transistor structure of claim 11, wherein the first semiconductor material comprises $In_xGa_{1-x}As$, and said one of the source region or the drain region comprises $In_yAl_{1-y}As$, wherein $0.51 \leq x \leq 0.55$, and $y \geq 0.6$.

15. The integrated circuit transistor structure of claim 11, wherein the first semiconductor material comprises $In_xGa_{1-x}As$, and said one of the source region or the drain region comprises $InAs_yP_{1-y}$, wherein $0.51 \leq x \leq 0.55$, and $y \geq 0.1$.

16. The integrated circuit transistor structure of claim 11, wherein the first semiconductor material comprises $In_xGa_{1-x}As$, and said one of the source region or the drain region comprises $In_yGa_{1-y}As_zP_{1-z}$, wherein $0.51 \leq x \leq 0.55$, $0.25 \leq y \leq 1.00$, and $0.50 \leq z \leq 1.00$.

17. The integrated circuit transistor structure of claim 11, wherein the first semiconductor material comprises InAs, and said one of the source region or the drain region comprises GaSb.

18. The integrated circuit transistor structure of claim 11, wherein the first semiconductor material comprises InAs, and said one of the source region or the drain region comprises $Ga_xAl_{1-x}Sb$, wherein $0.01 \leq x \leq 0.20$.

19. The integrated circuit transistor structure of claim 11, wherein the first semiconductor material comprises InAs, and said one of the source region or the drain region comprises $In_xGa_{1-x}Sb$, wherein $0.25 \leq x \leq 1.00$.

20. The integrated circuit transistor structure of claim 11, wherein the first semiconductor material comprises GaSb, and said one of the source region or the drain region comprises $In_xGa_{1-x}P_ySb_{1-y}$, wherein $0.25 \leq x \leq 1.00$, and $0.00 \leq y \leq 0.10$.

21. The integrated circuit transistor structure of claim 9, wherein the spacer comprises at least two of indium (In), gallium (Ga), arsenic (As), and antimony (Sb).

22. The integrated circuit transistor structure of claim 21, wherein said one of the source region or the drain region and the spacer are compositionally the same, except that said one of the source region or the drain region includes an impurity at a concentration in excess of 1E18 cm$^3$, and the impurity is either not included in the spacer or is included in the spacer at a concentration below 1E17 cm$^3$.

23. The integrated circuit transistor structure of claim 21, wherein said one of the source region or the drain region and the spacer are compositionally different, above and beyond any differences in impurity doping.

24. The integrated circuit transistor structure of claim 9, wherein said one of the source region or the drain region is either silicon or silicon and germanium, and the first semiconductor material is germanium.

25. The integrated circuit transistor structure of claim 24, wherein said one of the source region or the drain region and the spacer are compositionally the same, except that said one of the source region or the drain region includes an impurity at a concentration in excess of 1E18 cm$^3$, and the impurity is either not included in the spacer or is included in the spacer at a concentration below 1E17 cm$^3$.

* * * * *